(12) United States Patent
Kushta et al.

(10) Patent No.: US 7,868,257 B2
(45) Date of Patent: Jan. 11, 2011

(54) VIA TRANSMISSION LINES FOR MULTILAYER PRINTED CIRCUIT BOARDS

(75) Inventors: Taras Kushta, Tokyo (JP); Kaoru Narita, Tokyo (JP); Hirokazu Tohya, Tokyo (JP); Takanori Saeki, Kawasaki (JP); Tomoyuki Kaneko, Kawasaki (JP)

(73) Assignees: NEC Corporation (JP); NEC Electronics Corporation (JP)

( * ) Notice: Subject to any disclaimer, the term of this patent is extended or adjusted under 35 U.S.C. 154(b) by 1159 days.

(21) Appl. No.: 10/598,134

(22) PCT Filed: Mar. 9, 2005

(86) PCT No.: PCT/JP2005/004595

§ 371 (c)(1),
(2), (4) Date: Aug. 18, 2006

(87) PCT Pub. No.: WO2005/086554

PCT Pub. Date: Sep. 15, 2005

(65) Prior Publication Data

US 2007/0205847 A1 Sep. 6, 2007

(30) Foreign Application Priority Data

Mar. 9, 2004 (JP) ............................. 2004-065881

(51) Int. Cl.
*H01R 12/04* (2006.01)
*H05K 1/11* (2006.01)

(52) U.S. Cl. ...................................... 174/262; 361/792
(58) Field of Classification Search ......... 174/262–266; 361/792–795
See application file for complete search history.

(56) References Cited

U.S. PATENT DOCUMENTS

| 3,533,023 A | 10/1970 | Friend et al. |
| 3,895,435 A | 7/1975 | Turner et al. ................... 29/625 |
| 4,494,083 A * | 1/1985 | Josefsson et al. .............. 333/33 |
| 4,816,791 A | 3/1989 | Carnahan et al. .............. 333/33 |

(Continued)

FOREIGN PATENT DOCUMENTS

JP 10-041630 2/1998

(Continued)

*Primary Examiner*—Jeremy C Norris
(74) *Attorney, Agent, or Firm*—Hayes Soloway P.C.

(57) ABSTRACT

A via transmission line for a multilayer printed circuit board (PCB) in which a wave guiding channel is formed by a signal via or a number of signal vias, an assembly of ground vias surrounding the signal via or corresponding number of coupled signal vias, a set of ground plates from conductor layers of the multilayer PCB, and a clearance hole. In this via transmission line, the signal via, or the number of signal vias forms an inner conductive boundary, ground vias and ground plates from conductor layers of the multilayer PCB form an outer conductive boundary, and the clearance hole provides both isolation of the inner conductive boundary from the outer conductive boundary and high-performance broadband operation of the via transmission line by means of the predetermined clearance hole cross-sectional shape and dimensions where the cross-sectional shape of the clearance hole is defined by the arrangement of ground vias in the outer conductive boundary and dimensions of the clearance hole are determined according to a method to minimize frequency-dependent return losses caused by specific corrugations of the outer conductive boundary formed by ground plates in the wave guiding channel of the via transmission line.

46 Claims, 32 Drawing Sheets

U.S. PATENT DOCUMENTS

| | | | |
|---|---|---|---|
| 4,846,696 A | 7/1989 | Morelli et al. | 439/31 |
| 5,522,132 A | 6/1996 | Mattei | 29/846 |
| 5,828,555 A | 10/1998 | Itoh | 361/784 |
| 5,830,301 A | 11/1998 | Sturzebecher et al. | 156/89.16 |
| 5,842,877 A | 12/1998 | Martensson et al. | 439/91 |
| 5,930,665 A | 7/1999 | Cho et al. | 438/612 |
| 6,023,211 A | 2/2000 | Somei | 333/246 |
| 6,031,188 A | 2/2000 | Pluymers et al. | 174/255 |
| 6,232,849 B1 | 5/2001 | Flynn et al. | 333/26 |
| 6,388,206 B2 | 5/2002 | Dove et al. | 174/262 |
| 7,053,729 B2 * | 5/2006 | Aguirre et al. | 333/33 |
| 2006/0288574 A1 * | 12/2006 | Oggioni et al. | 29/852 |

FOREIGN PATENT DOCUMENTS

| | | |
|---|---|---|
| JP | 11-220311 | 10/1999 |
| JP | 2000-031709 | 1/2000 |
| JP | 2000-068716 | 3/2000 |
| JP | 2000-040903 | 8/2000 |
| JP | 2001-144511 | 5/2001 |
| JP | 2002-325004 | 8/2002 |
| JP | 2003-124636 | 4/2003 |
| JP | 2003-229511 | 8/2003 |

* cited by examiner

US 7,868,257 B2

VIA TRANSMISSION LINES FOR MULTILAYER PRINTED CIRCUIT BOARDS

TECHNICAL FIELD

This invention relates to transitions between planar layers of a multilayer printed circuit board (PCB) which are formed as broadband shielded via transmission lines which is formed by a signal via or a number of coupled signal vias as an inner conductive boundary, ground vias and ground layers from conductor layers of the multilayer PCB as an outer conductive boundary, and a clearance hole isolating the inner and outer conductive boundary of the via transmission line. The broadband operation of the transmission line is achieved by means of predetermined form and dimensions of the clearance hole. Shielded properties of the transmission line are provided by the outer boundary of the via transmission line formed by the ground vias and the ground plates. The characteristic impedance control is carried out by a determination of appropriate dimensions of inner and outer conductive boundaries of the via transmission line proceeding from a formula for corresponding coaxial waveguide with homogeneous continuous inner and outer conductive boundaries.

BACKGROUND ART

A multilayer printed circuit board (PCB) is usually consisted of a number of conductor layers used for ground and power planes, and also for forming signal planar interconnect circuits where the conductor layers are isolated by a material. Planar interconnect circuits at signal layers can be developed on the base of planar transmission lines (as for an example, varieties of microstrip lines, strip lines, coplanar lines, and slot lines) which have typically low return and leakage losses that give a possibility to develop high-performance planar circuits.

However, transitions providing connections between different signal layers of the multilayer PCB by means of via structures have usually high enough return and leakage losses that finally make worse the electrical performance of whole interconnect circuits embedded in the multilayer PCB.

DISCLOSURE OF THE INVENTION

Accordingly, they are primary objects of the present invention to provide the high performance in the wide frequency band of a via transition consisting of a signal via or a number of signal vias surrounded by ground vias and shielding properties of the via transition in a multilayer PCB.

The foregoing and other objects are achieved by forming a via transmission line in a multilayer PCB having guiding properties in the wide frequency band similar to a planar transmission line in the multilayer PCB. This via transmission line consists of a single via or a number of signal vias forming an inner conductive boundary of the via transmission line, an assembly of ground vias surrounding the signal via or the number of signal vias and ground plates from conductor layers of the multilayer PCB forming an outer conductive boundary of the via transmission line, and a cylindrical clearance hole isolating the inner and outer conductive boundaries. A wave guiding channel of the via transmission line is disposed between the inner and the outer conductive boundaries of the via transmission line. Ground vias jointly with ground plates forming the outer conductive boundary provide high-shielding characteristics of the via transmission line. The clearance hole consisting of the PCB isolating material establishes the broadband operation of the via transmission line by means of appropriate its shape and cross-sectional dimensions. Shape of the clearance hole is determined as corresponding to arrangement of ground vias in the outer conductive boundary of the via transmission line. As for an example, according to this method square, or rectangular, or circular arrangement of the ground vias in the outer conductive boundary of the via transmission line will respectively lead to square, or rectangular, or circular cross section of the clearance hole. Determination of cross-sectional dimensions of the clearance hole are based on two main points which are necessary to satisfy at the same time: 1) To provide shield properties of the outer conductive boundary of the via transmission line by means of full value connections between ground vias and ground plates; 2) To minimize dimensions of ground plates in the wave guiding channel of the via transmission line which are responsible for a frequency-dependent return loss.

BEST MODE FOR CARRYING OUT THE INVENTION

The following description of the preferred embodiments directed to a single via transmission line mainly but it, is well understood that it is not limited to such an application and can be used to any number of via transmission lines in a multilayer PCB, including that forming complex high-density via configurations, and also these via transmission lines can be jointed to any types of interconnect circuits including planar transmission lines embedded in the multilayer PCB, coaxial cables, pins from Large-Scale Integration (LSI) chip packages, and so on.

Figure 1A:
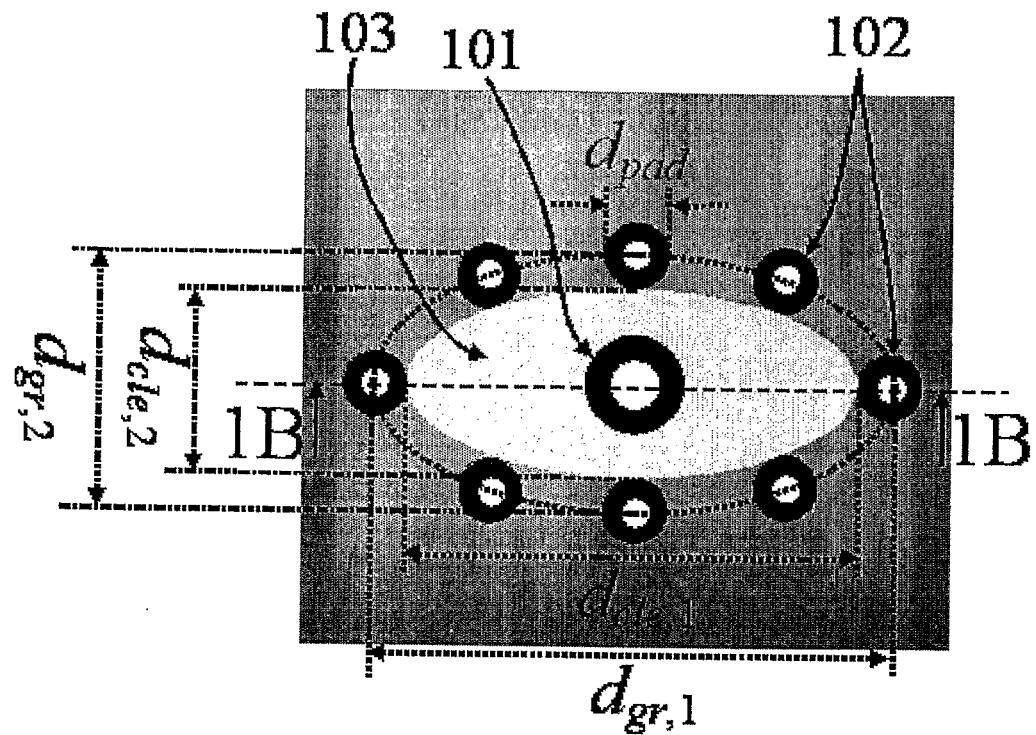
FIGS. 1A and 1B show top and cross-sectional views, respectively, of a via transmission line in a multilayer PCB having an elliptical arrangement of ground vias in an outer conductive boundary of the via transmission line and corresponding elliptical cross-sectional shape of a clearance hole with dimensions taking into account dimensional tolerances of a ground via fabrication technology.
Figure 1B:
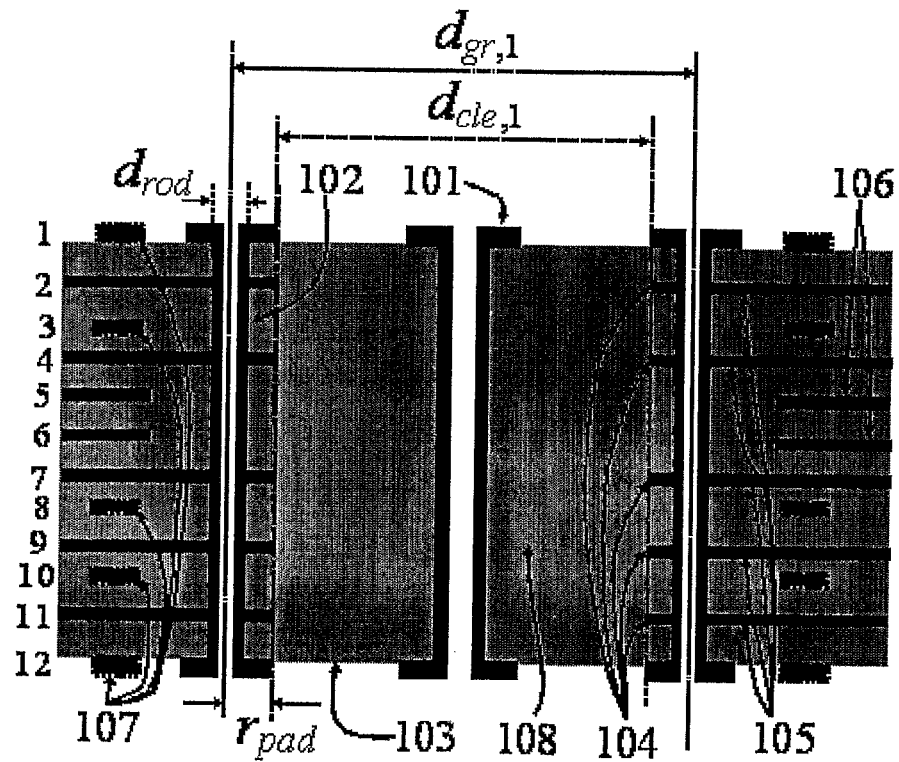
Figure 1C:
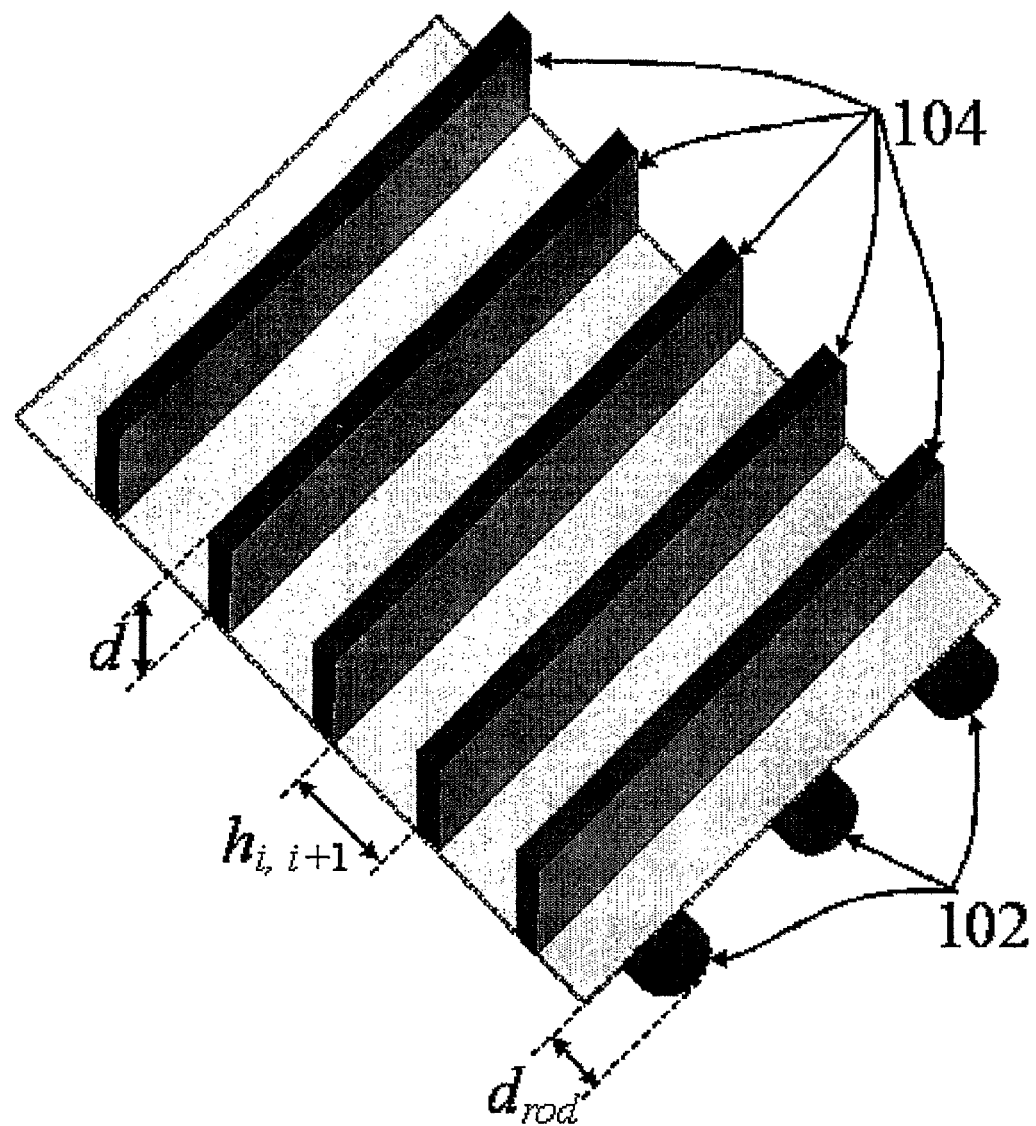
FIG. 1C shows a corrugated surface which serves as a model of the outer conductor boundary of the via transmission line.

Referring to the drawings, a via transmission line in a 12-conductor-layer PCB, which serves only as an example of multilayer PCB design consisting of ground planes 105, power supplying planes 106, signal layers 107, and isolating material 108, is shown in FIGS. 1A and 1B (numbering of conductive layers is demonstrated in FIG. 1B). The via transmission line consists of a signal via 101 (central conductor) forming an inner conductive boundary, ground vias 102 and ground plates 104 from conductor layers forming an outer conductive boundary and establishing shield properties, and clearance hole 103 isolating the inner conductive boundary from the outer conductive boundary and having the predetermined form and dimensions determined according to methods presented here to provide the wideband operation of the via transmission line lengthwise At first, using above-mentioned example of via transmission lines we explain a role of the clearance hole in forming a via transmission line. The outer conductive boundary of the via transmission line is formed by ground vias and ground plates in the wave guiding channel of the via transmission line which extends from the signal via to the ground vias in the transverse direction. In considered example, conductive parts of ground plates 104 and ground vias 102 can be approximately represented by a specific corrugated conductive surface as shown in FIG. 1C.

The effect of above-mentioned type of the corrugations of the outer conductive boundary of the via transmission line can be characterized by means of the surface impedance for this boundary which can be approximately determined as follows:

$$Z_s \approx 120\pi \cdot i \cdot \sqrt{\frac{\mu}{\varepsilon}} \cdot \tan\left(\frac{2\pi f}{c} d\sqrt{\varepsilon}\right), \quad (1)$$

where $Z_s$ is the surface impedance of the corrugated surface, d is the corrugation depth which in is defined as $d \approx r_{gr} - r_{ole} - r_{od}$ for the via transmission line, $r_{gr}$ is the distance from the center of the signal via to the corresponding ground via center (in FIGS. 1A and 1B, $r_{gr}$ is taken as $r_{gr,1} = d_{gr,1}/2$ or $r_{gr,2} = d_{gr,2}/2$), $r_{ole}$ is the characteristic dimension of the clearance hole (in FIGS. 1A and 1B, $r_{ole}$ is taken as $r_{ole,1} = d_{ole,1}/2$ or $r_{ole,2} = d_{ole,2}/2$), $r_{rod} = d_{rod}/2$ is the outer radius of the ground via rod, f is the frequency, c is the velocity of light in free space, $\mu$ is the relative permeability of the PCB isolating material, and $\varepsilon$ is the relative permittivity of the PCB isolating material. Equation 1 is valid for $h_{i,i+1} \ll \lambda$, where $h_{i,i+1}$ is the distance between neighboring i and i+1 conductor layers of the multilayer PCB forming the outer conductive boundary of the via transmission line as shown in FIG. 1C, and $\lambda$ is taken as the shortest wavelength in the isolation material of the multilayer PCB at the predetermined frequency range.

Equation 1 demonstrates particularly that if such type of corrugations in a via transition formed by, a signal via as an inner conductive boundary and ground vias and ground plates from conductor layers of a multilayer PCB as an outer conductive boundary exists, and the corrugation depth is large enough, then the surface impedance of the outer conductive boundary of the via transition is strongly dependent on the frequency. It is clear, that this circumstance will lead to frequency-dependent return and insertion losses for a propagating high-speed signal. From a practical viewpoint it means that it is difficult to provide broadband matching in interconnect structures having usually approximately constant (frequency-independent) characteristic impedance, as for an example 50 ohms, through all interconnect paths. Thus, as a result to obtain the broadband operation in the via transition, above-mentioned corrugations of the outer conductive boundary have to be small as possible, that is, d have to approach to 0. If this condition will be satisfied, then an approximate equation for the surface impedance can be written as follows:

$$Z_s \approx 0. \quad (2)$$

Equation 2 shows that there is no dependency against frequency originated by the corrugations of the outer conductive boundary of the via transition shaped by ground plates from conductor layers of the multilayer PCB, and a via transmission line can be formed on the base of satisfaction of this equation. We called above-mentioned via transitions as "via transmission lines" due to a possibility to form vertical interconnect structures for multilayer PCBs with properties similar to planar transmission lines, that is, having low return and leakage losses in the wide frequency band.

Note that Equation 2 was obtained under a condition that an outer conductive boundary of the via-transition was considered as continuous one. However, it is clear that this condition cannot be usually satisfied in a via transition formed in a multilayer PCB due to a separation of ground vias in the outer conductive boundary of the via transition. This separation means that this boundary is open, that is, leakage of the electromagnetic wave through such type of conductive boundaries can be present. This leakage is a very important factor contributing in crosstalk effects and finally in the electrical performance of interconnect circuits embedded in a multilayer PCB. That is why, it is necessary to form the outer conductive boundary of a via transmission line which will approximately display properties of a closed (continuous) boundary. It is practically possible if: 1) To keep the distance between neighboring ground vias less then $\lambda/8$ where $\lambda$ is taken as the shortest wavelength in the isolation material of the multilayer PCB at the predetermined frequency range; 2) To use the ground plates from conductor layers of the multilayer PCB in forming the outer conductive boundary of the via transmission line and to provide their full value connections to the ground vias.

As a conclusion, a via transmission line can be formed by a signal via (or a number of signal vias) as an inner conductive boundary, ground vias and ground plates from conductor layers of a multilayer PCB as an outer conductive boundary, a clearance hole not only isolating the inner and the outer conductive boundaries but also having specific cross-sectional form and dimensions of the outer cylindrical boundary coming into contact with the outer conductive boundary of the via transmission line. Based on the satisfaction of Equation 2, the cross-sectional form of the outer boundary of the clearance hole can be defined as corresponding to arrangement of ground vias in the outer conductive boundary of the via transmission line. According to this method a square arrangement of ground vias in the outer conductive boundary of the via transmission line gives the square cross-section of the clearance hole, or a circular arrangement of ground vias fixes the circular cross-section of the clearance hole, or an elliptical arrangement of ground vias leads to the elliptical clearance hole, and so on.

Determination of cross-sectional dimensions of the clearance hole in a via transmission line is based on both satisfaction of Equation 2 and a guarantee of connections of ground vias to conductor plates of full value at forming the outer conductive boundary of the via transmission line. In our considerations, characteristic cross-sectional dimensions of a clearance hole in a via transmission line can be defined on the base of following methods.

Determining corrugation depth d (see Equation 1) as d≈0, formula for definition of characteristic cross-sectional dimensions of the clearance hole can be written as follows:

$$r_{ole} = r_{gr} - r_{rod}. \quad (3)$$

In most of real applications, it is convenient to use another method of determination of cross-sectional dimensions of the clearance hole taking into account dimensional tolerances of a ground via fabrication technology. In this case, the corrugation depth should be considered as not equal to zero (d≈$r_{gr}$−$r_{ole}$−$r_{rod}$≠0), that gives the following basic equation for definition of the clearance hole characteristic cross-sectional dimensions:

$$r_{ole} = r_{gr} - r_{pad}. \quad (4)$$

where $r_{pad}$ is the pad radius for the ground via which is determined by dimensional tolerances of used via fabrication technology to provide full value connections of the ground via to ground plate from conductor layers of a multilayer PCB.

Return to the structure in FIGS. 1A and 1B where the via transmission line in the multilayer PCB with an elliptical arrangement of ground vias 101 in the outer conductive boundary and the central position of a signal via 101 is shown. A clearance hole 103 in this via transmission line was formed by the following way. The cross-sectional shape of the clearance hole is chosen as an elliptical one that is corresponding to arrangement of ground vias in the outer conductive boundary. The dimensions of the elliptical form for the clearance hole are determined on the base of Equation 4 keeping minimal corrugations in the wave guiding channel of the via transmission line which are necessary to provide full value connections of ground vias and ground plates from conductor layers of the multilayer PCB. Thus, two characteristic dimensions determining the clearance hole of elliptical form such as $d_{ole,1}$ and $d_{ole,2}$ (see FIGS. 1A and 1B) are defined as follows:

$$d_{ole,1} = d_{gr,1} - d_{pad} \quad (5)$$

$$d_{ole,2} = d_{gr,2} - d_{pad}. \quad (6)$$

where $d_{pad} = 2r_{pad}$ is the diameter of the ground via pad which is defined by dimensional tolerances of a technology applied for via fabrications in the multilayer PCB to provide a full value connection of a ground via and a ground plate.

Figure 2A:
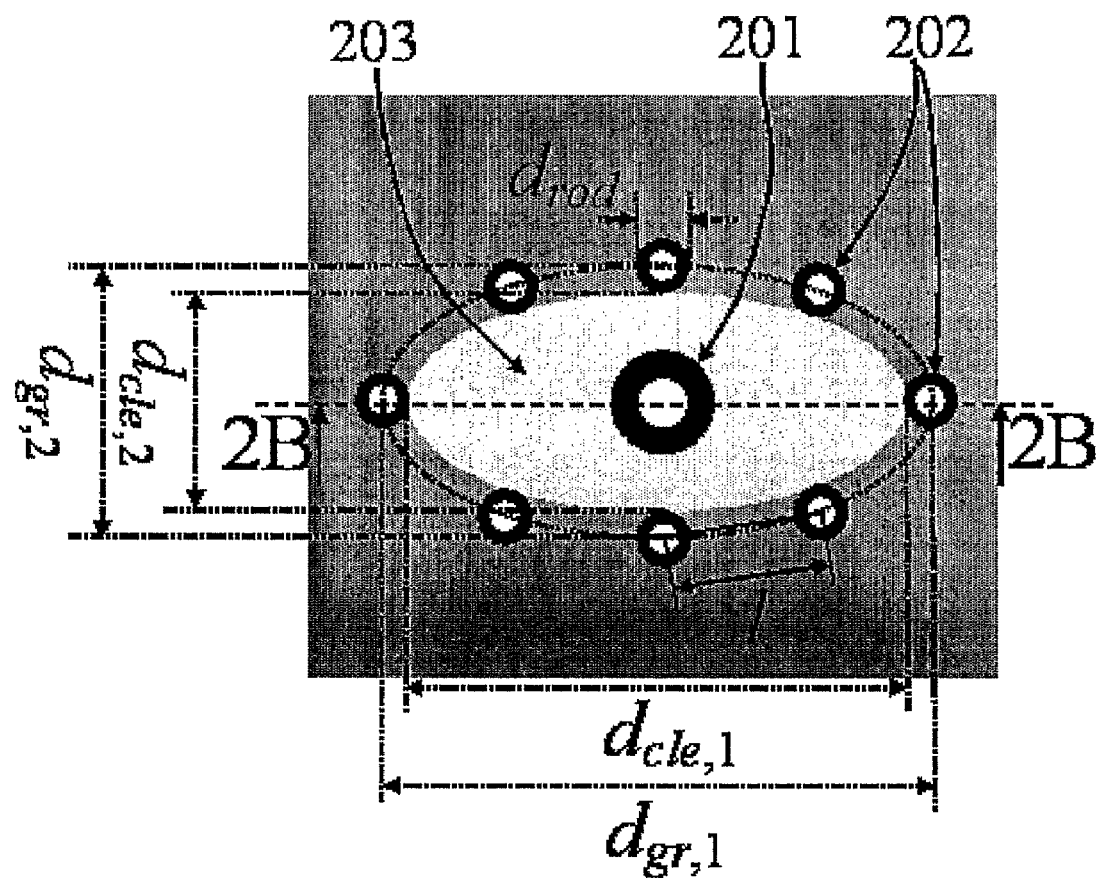
FIGS. 2A and 2B show top and cross-sectional views, respectively, of a via transmission line in a multilayer PCB having an elliptical arrangement of ground vias in an outer conductive boundary of the via transmission line and corresponding elliptical cross-sectional shape of a clearance hole with dimensions extended directly to the outer conductive surface of ground via rods.
Figure 2B:
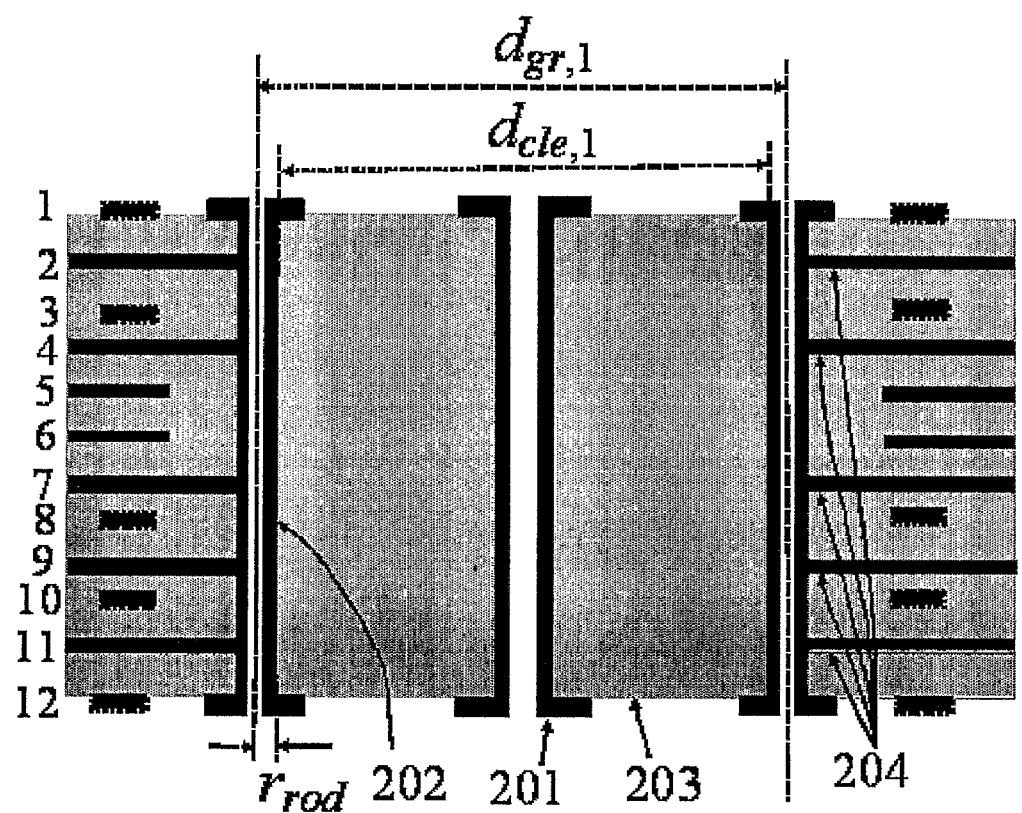

In FIG. 2, the same arrangement of ground vias 202 in an outer conductive boundary of a via transmission line with a central signal via 201 is shown. However, the dimensions of the clearance hole 203 are chosen according to Equation 3 realizing d≈0 in the wave guiding channel of the via transmission line and keeping connections of ground vias 202 to ground plates 204, that is:

$$d_{ole,1} = d_{gr,1} - d_{rod} \quad (7)$$

$$d_{ole,2} = d_{gr,2} - d_{rod}. \quad (8)$$

Figure 3A:
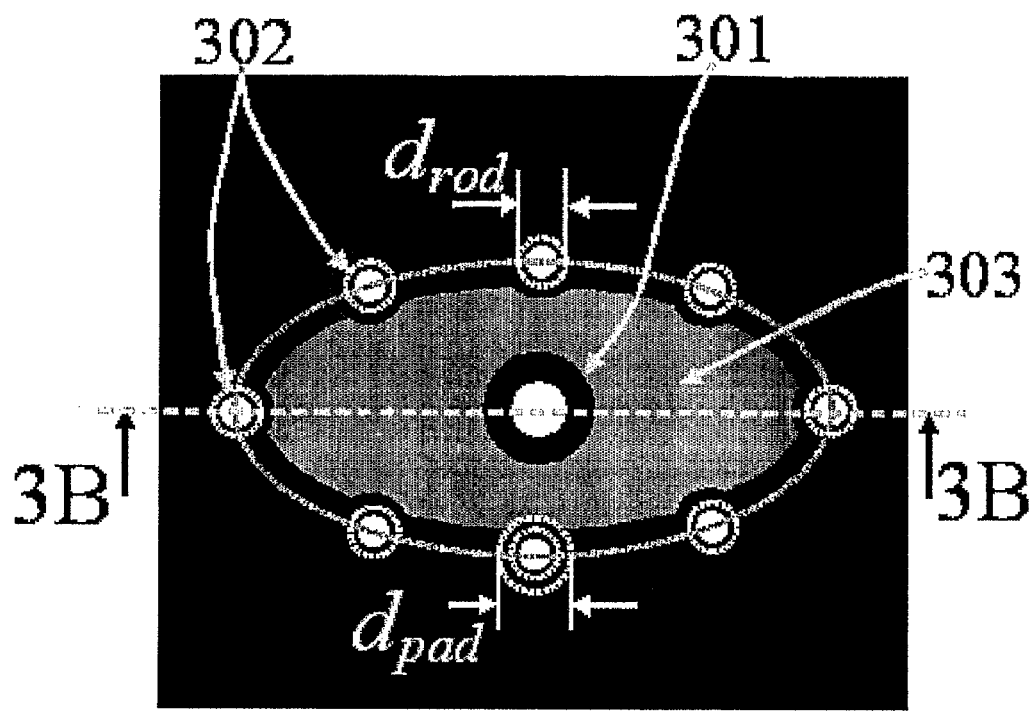
FIGS. 3A and 3B show top and cross-sectional views, respectively, of a via transmission line in a multilayer PCB having an elliptical arrangement of ground vias in an outer conductive boundary of the via transmission line and corresponding elliptical cross-sectional shape of a clearance hole with dimensions extended directly to the outer conductive surface of ground via rods and, in addition, cylindrical ground via pads are formed around ground vias for dimensional tolerances of the ground via fabrication.
Figure 3B:
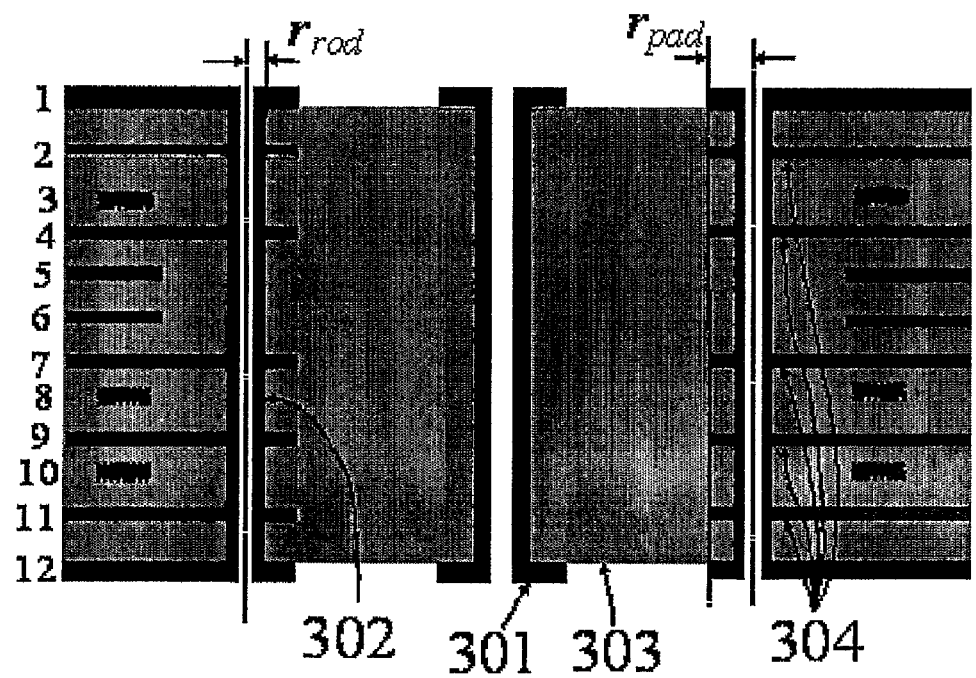

Another type of a clearance hole 303 providing the broadband operation of a via transmission line with an elliptical arrangement of ground vias 302 and a central signal via 301 is shown in FIG. 3. This clearance hole having elliptical shape mainly was developed on the base of the satisfaction of Equation 3 but, in addition, pads for ground vias determined by dimensional tolerances are foreseen for full-value connections of ground vias 302 to ground plates 304.

Clearance hole of circular cross-sectional form can be also used to realize a broadband operation of a via transmission line. In this case, the radius of the cross-section for such type of the clearance hole can be defined from Equation 3 as:

$$r_{ole,c} = r_{gr,c} - r_{rod} \quad (9)$$

where $r_{gr,c}$ is the distance from the center of the signal via to the center of the nearest ground via from the outer conductive boundary of the via transmission line.

Or, on the base of Equation 4 the radius of a circular clearance hole for a via transmission line in a multilayer PCB can be obtained as following:

$$r_{ole,c} = r_{gr,c} - r_{pad}. \quad (10)$$

Figure 4A:
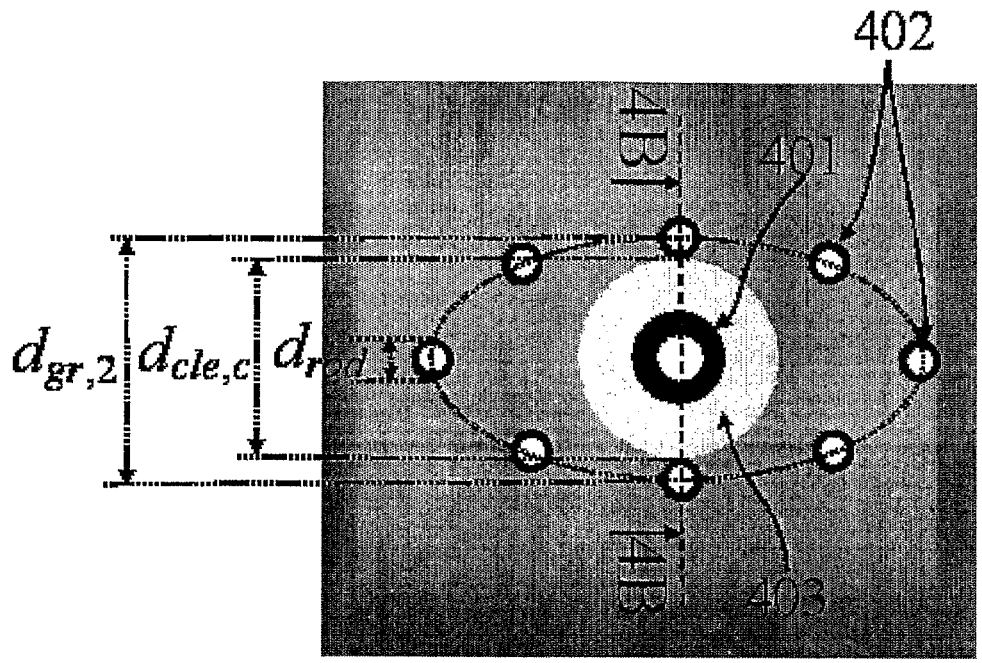
FIGS. 4A and 4B show top and cross-sectional views, respectively, of a via transmission line in a multilayer PCB having an elliptical arrangement of ground vias in an outer conductive boundary of the via transmission line and a circular cross-sectional shape of a clearance hole with dimensions extended directly to the outer conductive surface of the ground via rods which are the nearest to a signal, via of the via transmission line.
Figure 4B:
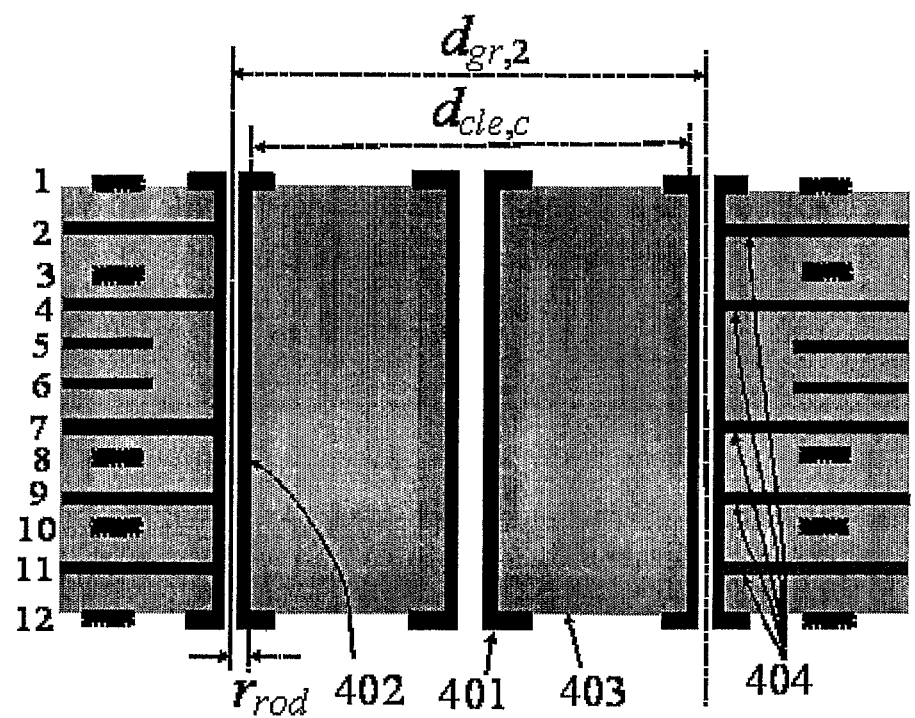

Developed according to this approach a via transmission line in a multilayer PCB is shown in FIG. 4. In this figure the via transmission line with an elliptical arrangement of ground vias 402 and a central signal via 401 is shown. Clearance hole 403 of the circular cross-sectional shape was determined by the use of Equation 9.

Figure 5A:
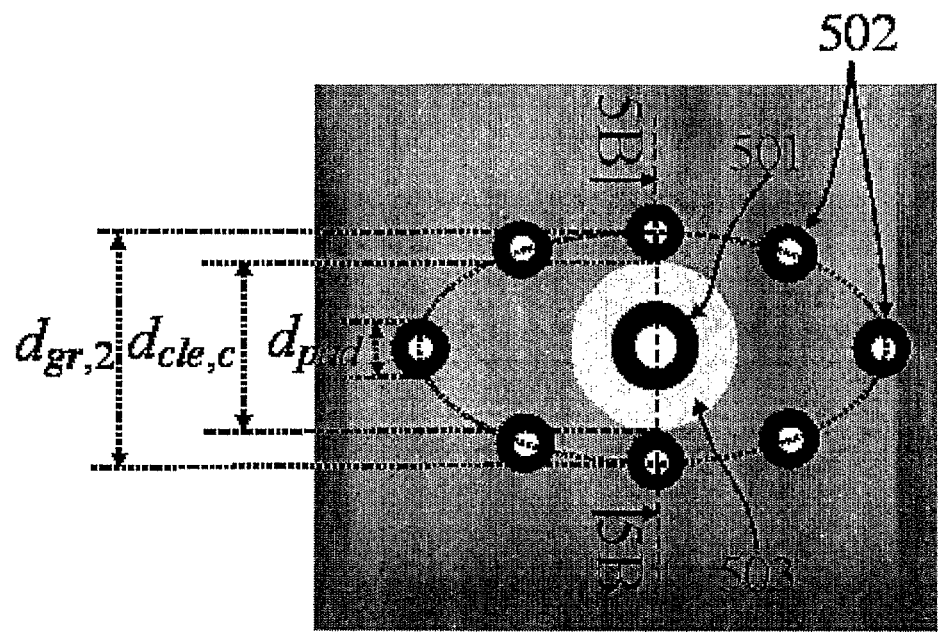
FIGS. 5A and 5B show top and cross-sectional views, respectively, of a via transmission line in a multilayer PCB having an elliptical arrangement of ground vias in an outer conductive boundary of the via transmission line and a circular cross-sectional shape of a clearance hole with dimensions extended directly to the center of the ground via rods, which are the nearest to a signal via of the via transmission line, minus the radius of the cylindrical pad for the ground via determined by dimensional tolerances of a via fabrication technology.
Figure 5B:
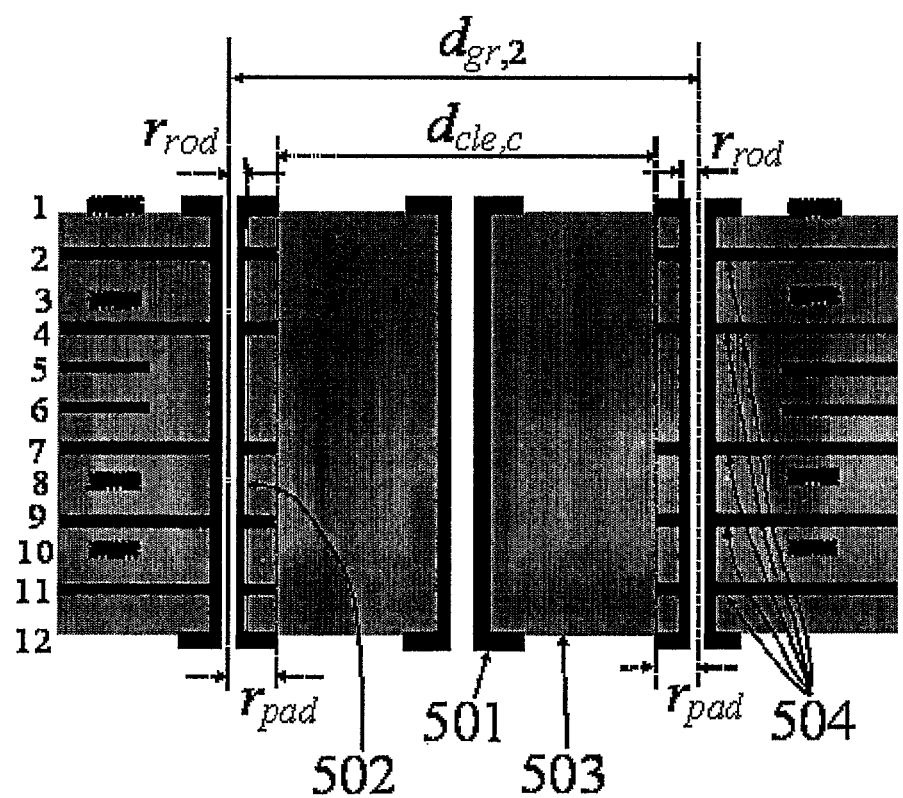

A via transmission line in a multilayer PCB with an elliptical arrangement of ground vias 502 in the outer conductive boundary and a central signal via 501 is shown in FIG. 5. In this via transmission line, a circular clearance hole 503 is formed according to Equation 10.

Figure 6A:
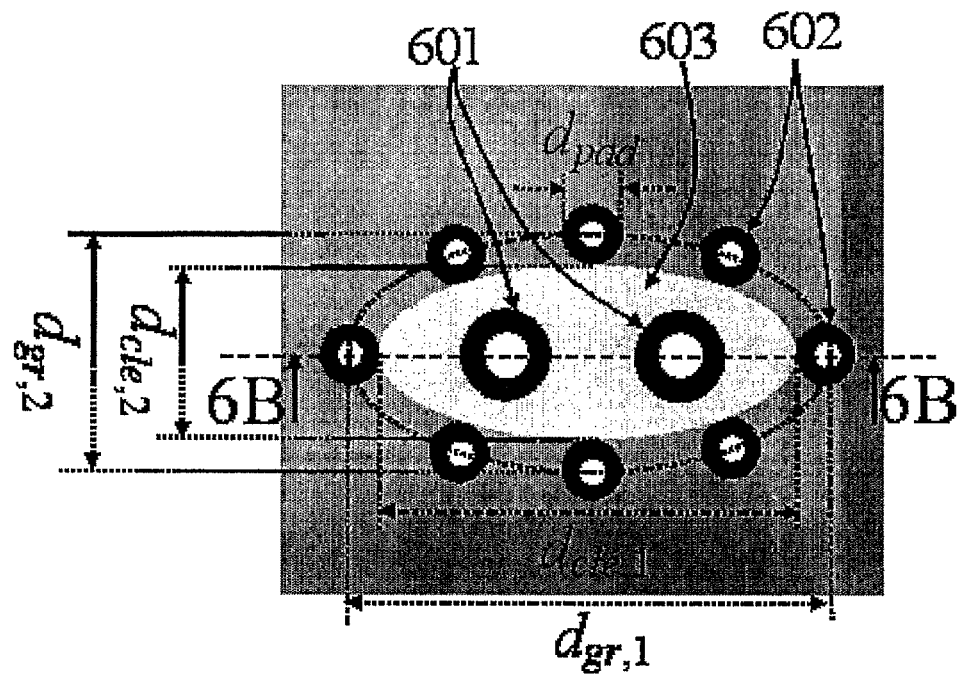
FIGS. 6A and 6B show top and cross-sectional views, respectively, of a via transmission line including a pair of signal vias for differential signaling in a multilayer PCB and having an elliptical arrangement of ground vias in an outer conductive boundary of the via transmission line and corresponding elliptical cross-sectional shape of a clearance hole with dimensions taking into account dimensional tolerances of a ground via fabrication technology.
Figure 6B:
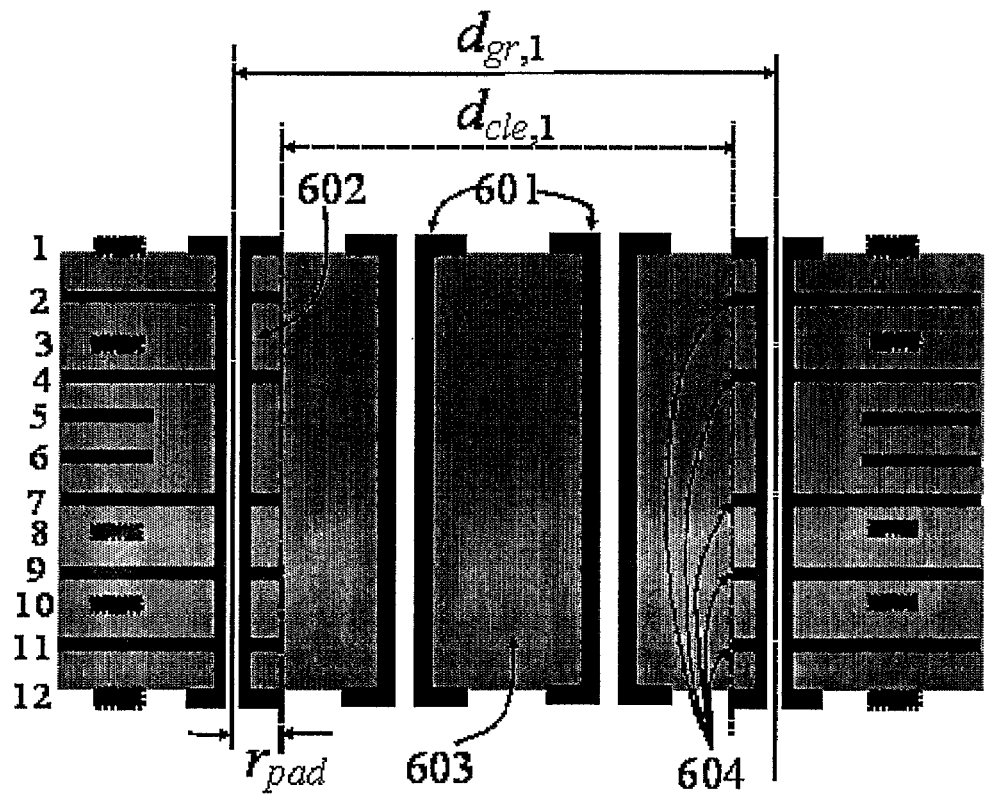

Above-mentioned examples of via transmission lines included a single signal via. However, not only the single via but also a number of signal vias as an inner conductive boundary can be used to develop a via transmission line for a multilayer PCB. In FIG. 6, an important case from practical viewpoint of a via transmission line is shown which realizes a via structure for differential signaling. Shown in the figure, a via transmission line consists of a pair of signal vias 601, ground vias 602 of an elliptical arrangement, ground plates 604 from conductor layers of the multilayer PCB, and a clearance hole 603 of corresponded elliptical cross-sectional shape and dimensions determined according to Equations 5 and 6.

Figure 7A:
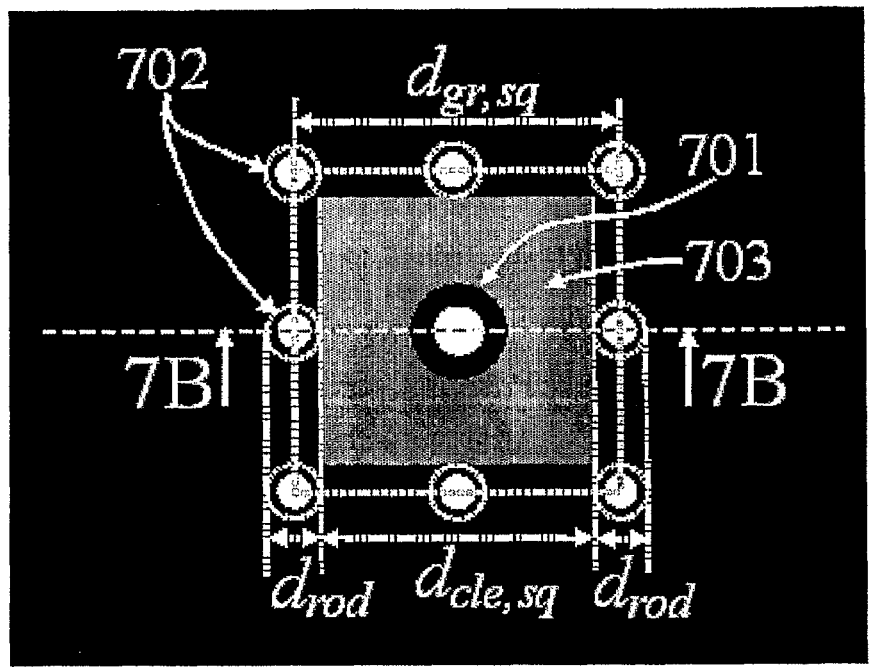
FIGS. 7A and 7B show top and cross-sectional views, respectively, of a via transmission line in a multilayer PCB having a square arrangement of ground vias in an outer conductive boundary of the via transmission line and corresponding square cross-sectional shape of a clearance hole with dimensions extended directly to the outer conductive surface of ground via rods which are the nearest to a signal via of the via transmission line.
Figure 7B:
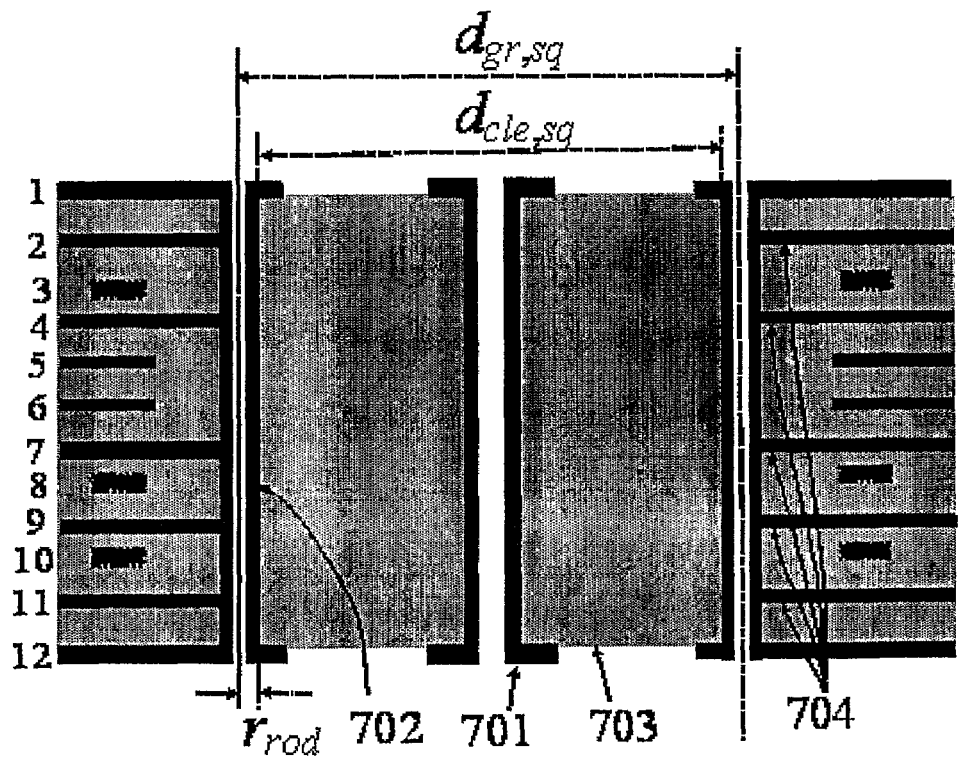

A via transmission line in a multilayer PCB with a square arrangement of ground vias 702 in an outer conductive boundary, ground plates 704, and a central signal via 701 is shown in FIG. 7. To provide a broadband operation a clearance hole 703 has also corresponded square cross-sectional shape, and cross-sectional dimensions of this clearance hole were determined on the base of Equation 3. Thus, the side of the clearance hole 703 is determined by the following equation:

$$d_{ole,sq} = d_{gr,sq} - d_{rod} \quad (11)$$

where $d_{gr,sq}$ is the distance between centers of ground vias from the outer conductive boundary as shown in FIG. 7.

Figure 8A:
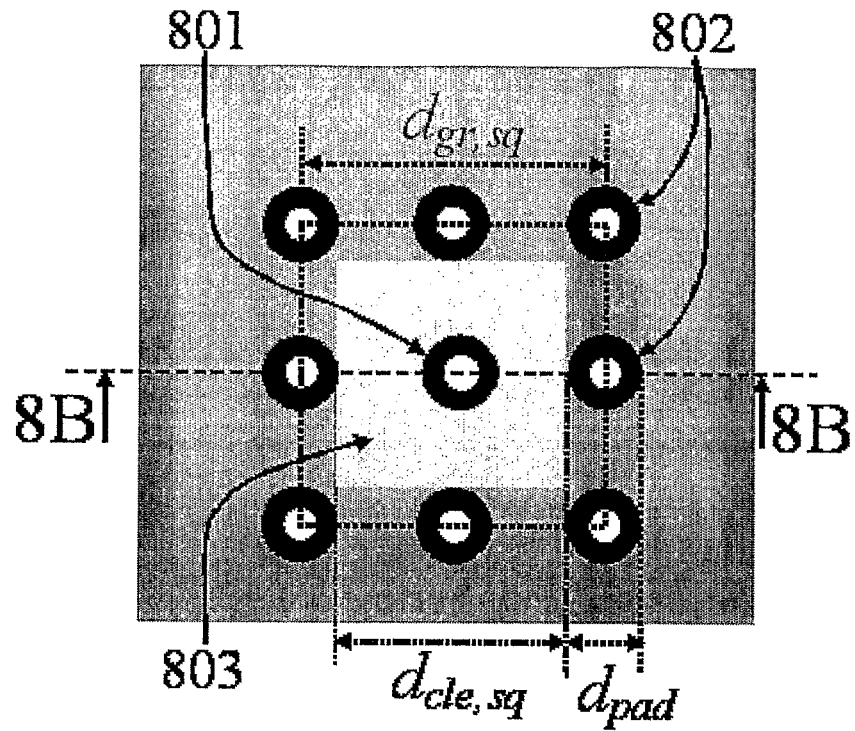
FIGS. 8A and 8B show top and cross-sectional views, respectively, of a via transmission line in a multilayer PCB having a square arrangement of ground vias in an outer conductive boundary of the via transmission line and corresponding square cross-sectional shape of a clearance hole with dimensions taking into account dimensional tolerances of a ground via fabrication technology.
Figure 8B:
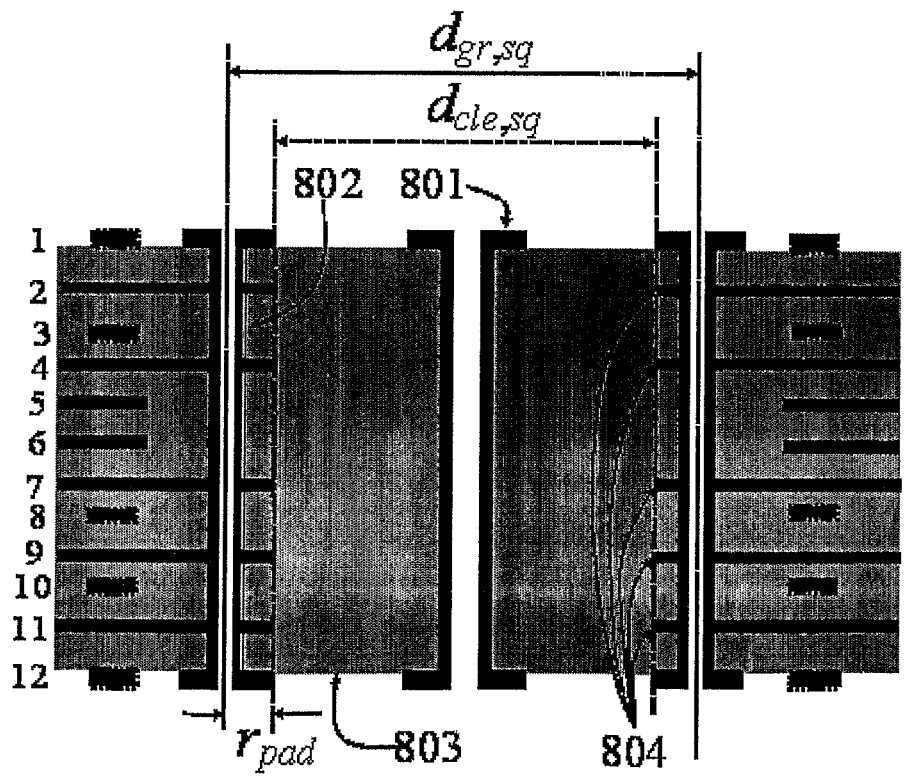

In FIG. 8, a square arrangement of the ground vias 802 in an outer conductive boundary of a via transmission line, ground plates 804 and a central signal via 801 are shown.

However, dimensions of a clearance hole 803 are determined on the base of Equation 4 to provide dimensional tolerances for full value connections of ground vias and ground plates, that is:

$$d_{ole,sq} = d_{gr,sq} - d_{pad} \qquad (12)$$

Figure 9A:
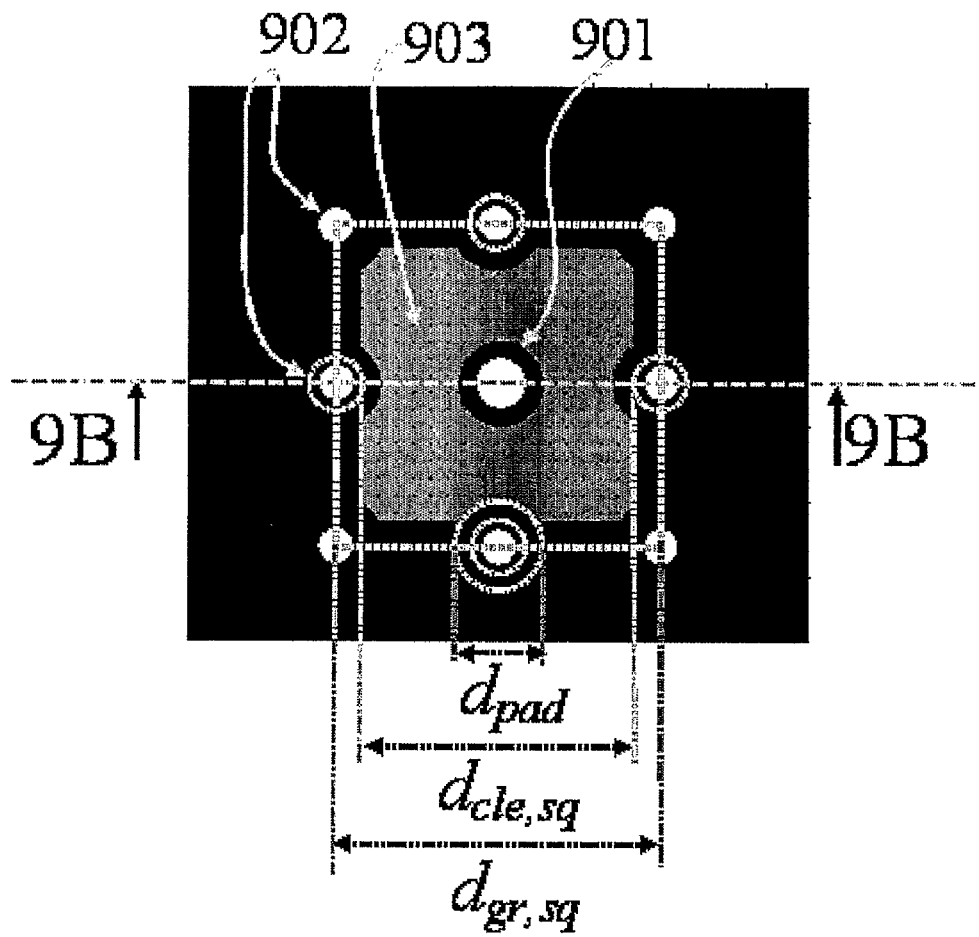
FIGS. 9A and 9B show top and cross-sectional views, respectively, of a via transmission line in a multilayer PCB having a square arrangement of ground vias in an outer conductive boundary of the via transmission line and corresponding-square cross-sectional shape of a clearance hole with dimensions extended directly to the outer conductive surface of the nearest ground via rods and, in addition, circular ground vias pads are formed taking into account dimensional tolerances of the ground via fabrication technology.
Figure 9B:
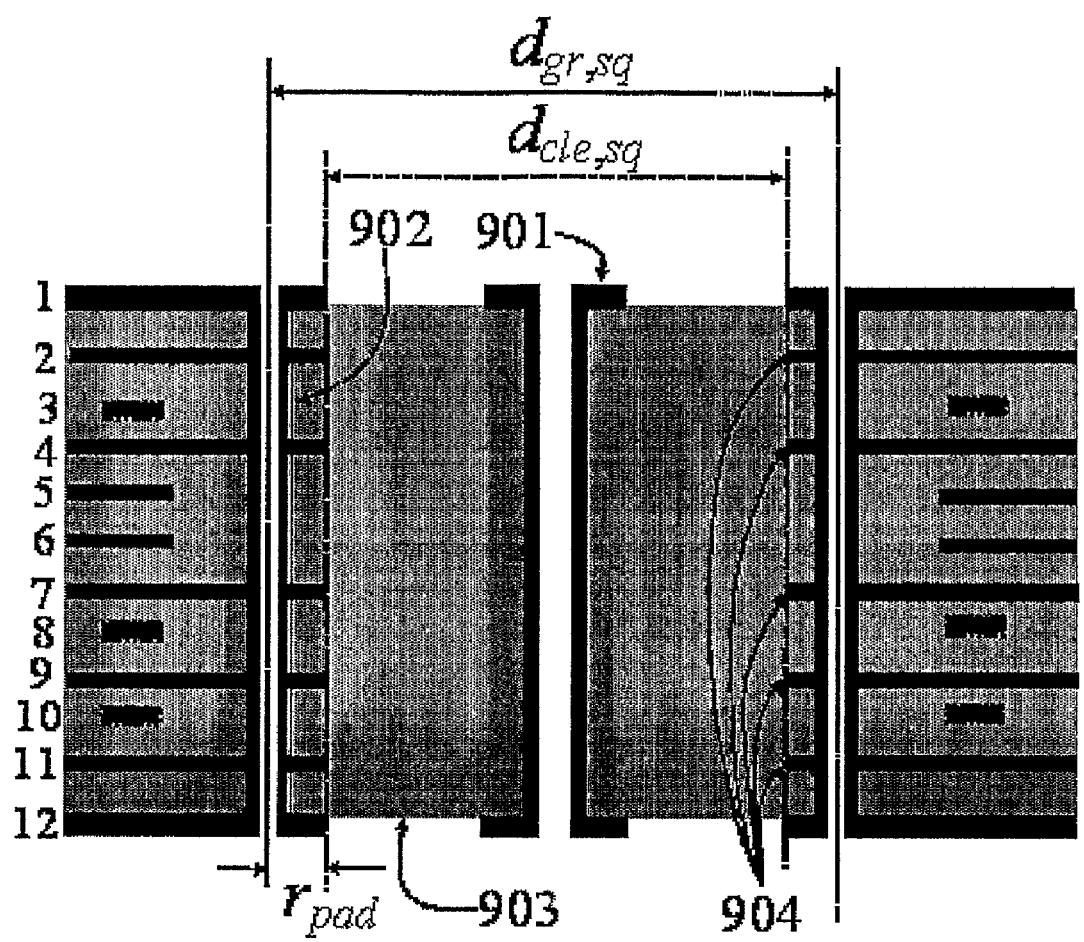

Also, a square arrangement of ground vias 902 in an outer conductive boundary of a via transmission line in a multilayer PCB, ground plates 904 and a central signal via 901 are shown in FIG. 9. For this via transmission line, the dimensions of a square clearance hole 903 are determined according to equation 11. In addition, the pad with diameter, $d_{pad}$, is formed around each ground via for full value connections of ground vias 902 and ground plates 904 taking into account dimensional tolerances of a via fabrication technology.

Figure 10A:
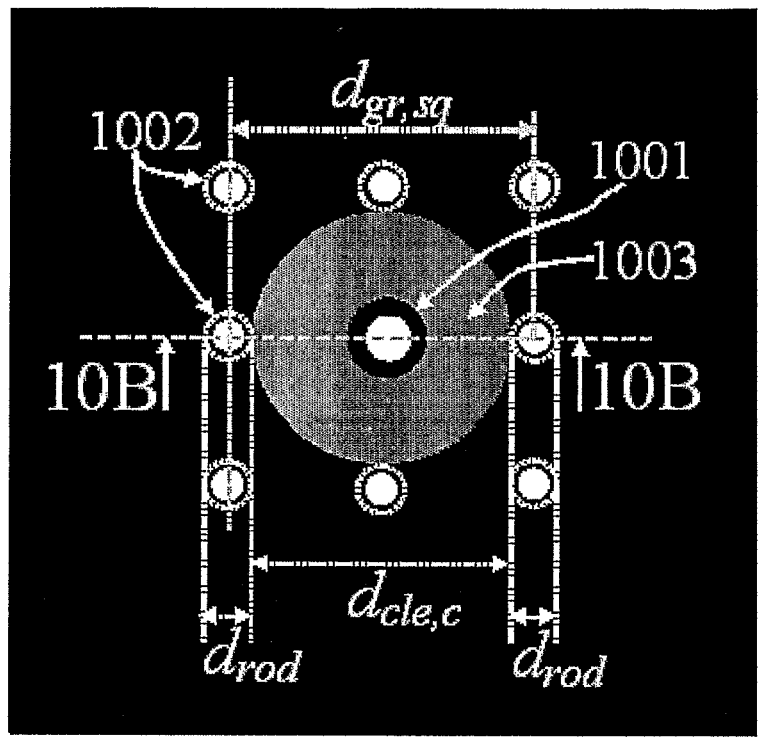
FIGS. 10A and 10B show top and cross-sectional views, respectively, of a via transmission line in a multilayer PCB having a square arrangement of ground vias in an outer conductive boundary of the via transmission line and a circular cross-sectional shape of a clearance hole with dimensions extended directly to the outer conductive surface of the ground via rods which are the nearest to a signal via of the via transmission line.
Figure 10B:
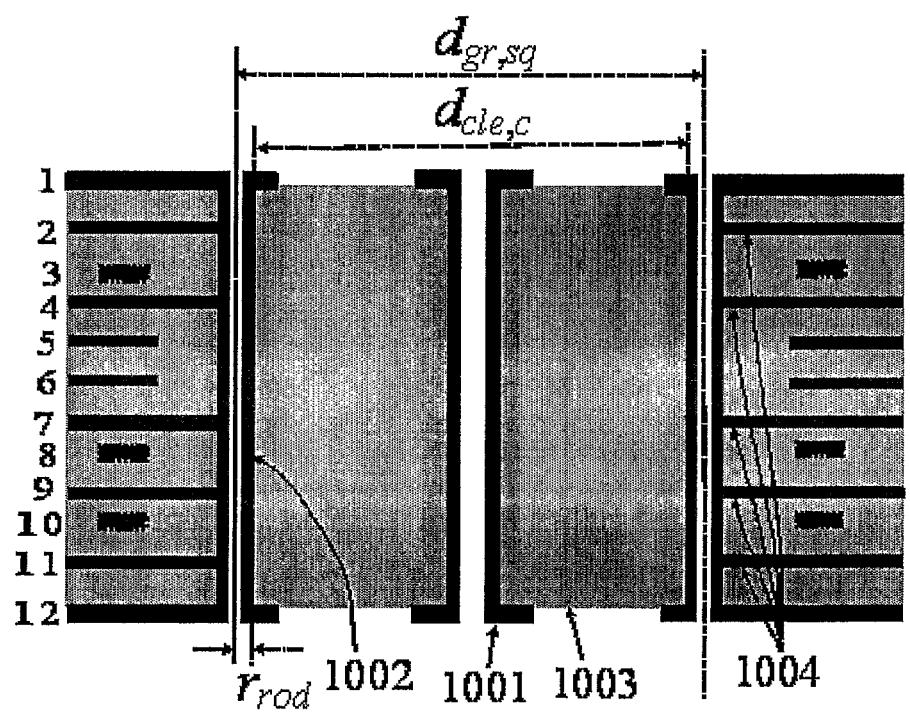

In FIG. 10, a square arrangement of the ground vias 1002 in an outer conductive boundary of a via transmission line for a multilayer PCB, ground plates 1004 and a central signal via 1001 are demonstrated. However, the cross-sectional shape of a clearance hole 1003 in the via transmission line is circular one, and the radius of this clearance hole is determined according to Equation 9 providing a minimal corrugation effect in the via transmission line with considered type of the clearance hole shape.

Figure 11A:
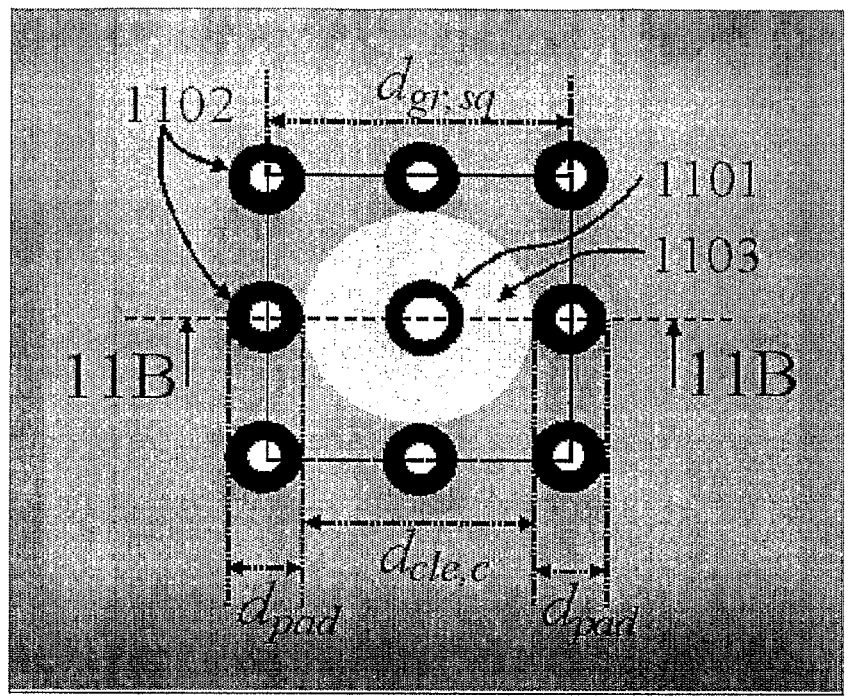
FIGS. 11A and 11B show top and cross-sectional views, respectively, of a via transmission line in a multilayer PCB having a square arrangement of ground vias in an outer conductive boundary of the via transmission line and a circular cross-sectional shape of a clearance hole with dimensions extended directly to the center of the ground via rods, which are the nearest to a signal via of the via transmission line, minus the radius of the cylindrical pad for the ground via determined by dimensional tolerances of a via fabrication technology.
Figure 11B:
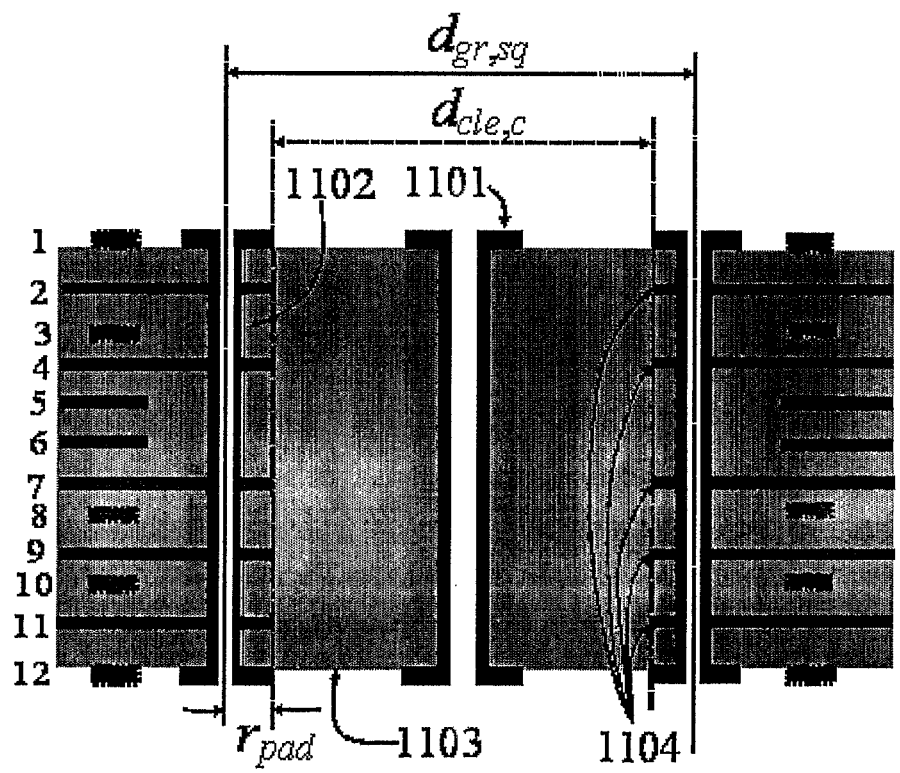

Square arrangement of the ground vias 1102 in an outer conductive boundary, ground plates 1104 and a central signal via 1101 of a via transmission line for a multilayer PCB are shown in FIG. 11. In this type of via transmission line the radius of a circular clearance hole 1103 is determined according to Equation 10 to foresee dimensional tolerances for full value ground via and ground plate connections.

Figure 12A:
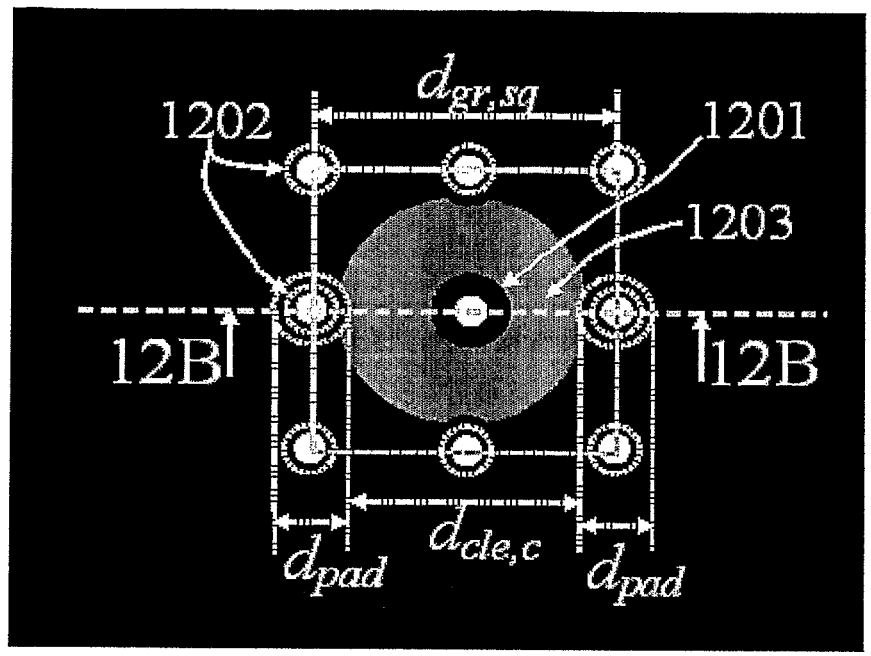
FIGS. 12A and 12B show top and cross-sectional views, respectively, of a via transmission line in a multilayer PCB having a square arrangement of ground vias in an outer conductive boundary of the via transmission line and a circular cross-sectional shape of a clearance hole with dimensions extended directly to the outer conductive surface of the ground via rods, which are the nearest to a signal via of the via transmission line, and, in addition, cylindrical ground vias pads are formed around ground vias for dimensional tolerances of a ground via fabrication technology.
Figure 12B:
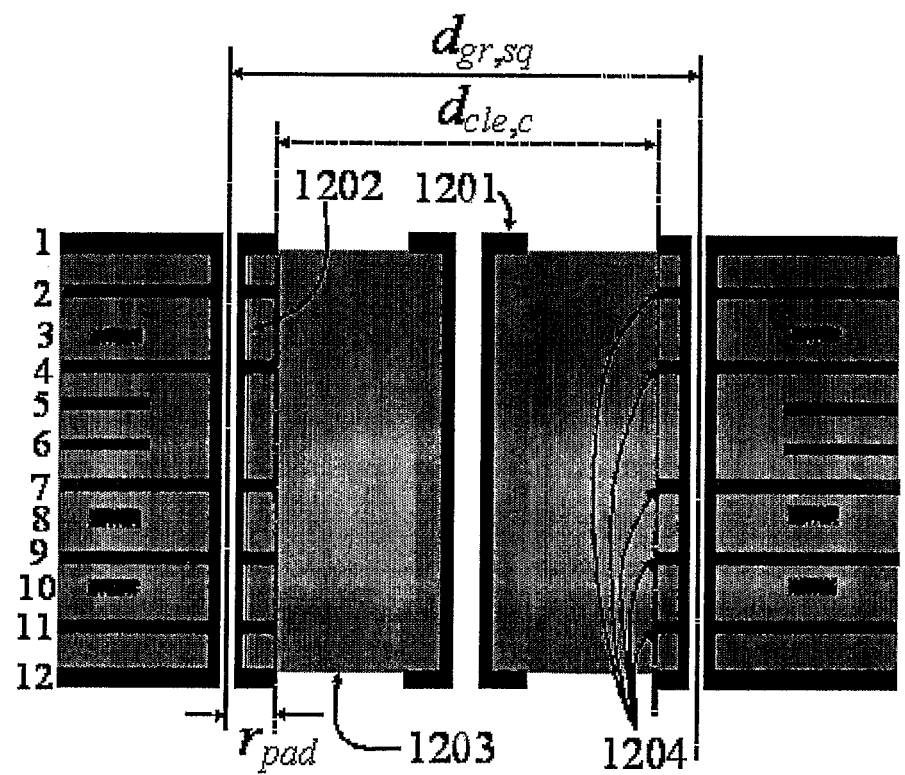

A via transmission line in a multilayer PCB with a square arrangement of ground vias 1202 in an outer conductive boundary, ground plates 1204 and a central signal via 1201 is shown in FIG. 12. A circular clearance hole is determined according to Equation 9 and, in addition, cylindrical pad is formed around ground vias for full value connections of ground vias 1202 and ground plates 1204 taking into account dimensional tolerances of a via fabrication technology.

Consider a type of arrangements of ground vias in the outer conductive boundary of via transmission lines embedded in a multilayer PCB as a circular one.

Figure 13A:
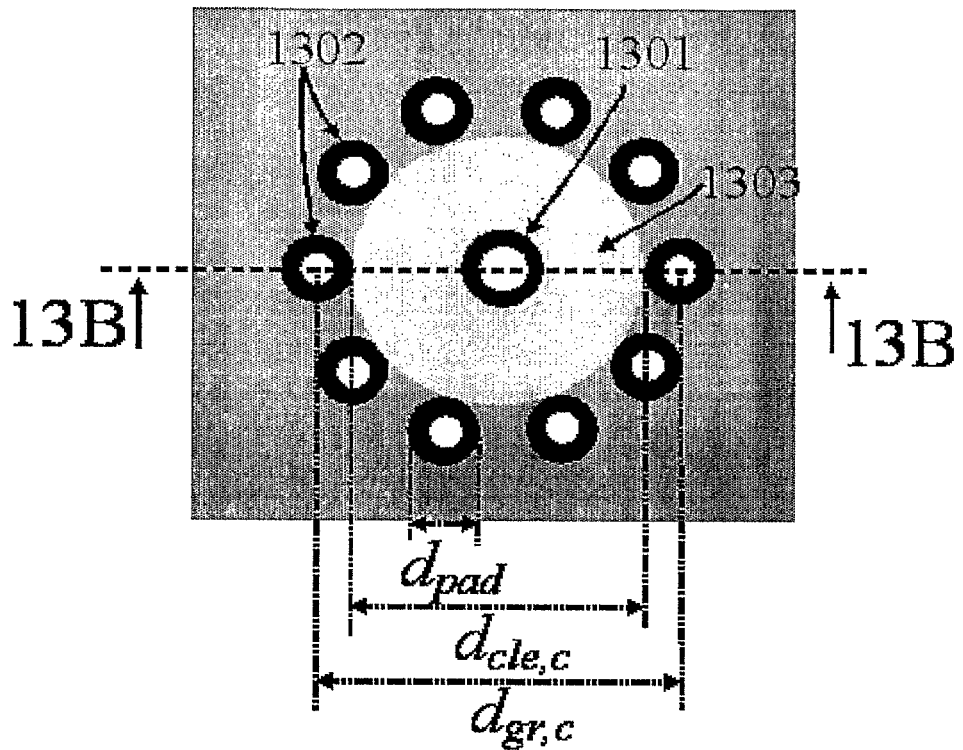
FIGS. 13A and 13B show top and cross-sectional views, respectively, of a via transmission line in a multilayer PCB having a circular arrangement of ground vias in an outer conductive boundary of the via transmission line and corresponding circular cross-sectional shape of a clearance hole with dimensions taking into account dimensional tolerances of a ground via fabrication technology.
Figure 13B:
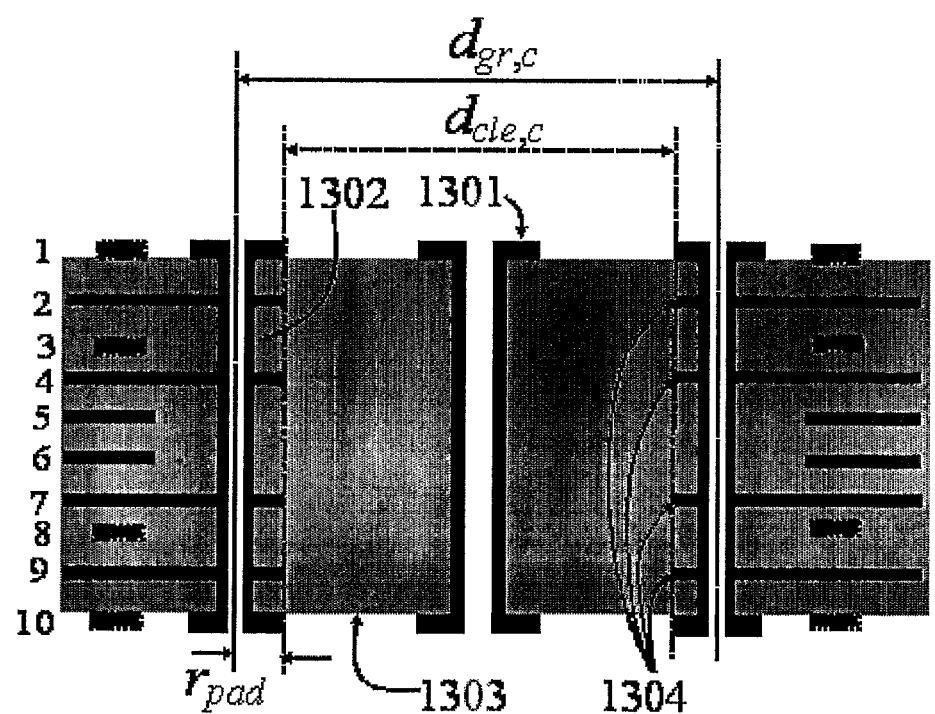

In FIG. 13, a via transmission line with a circular arrangement of ground vias 1302, ground plates 1304, and a central signal via 1301 in a multilayer PCB (a 10-conductor-layer PCB is demonstrated only as an example of PCB design) is shown. This ground via arrangement leads to corresponding circular shape of the clearance hole 1303. The radius of this clearance hole is defined according to Equation 10 to provide dimensional tolerances for full value connections of ground vias and ground plates and a broadband operation of the via transmission line.

Figure 14A:
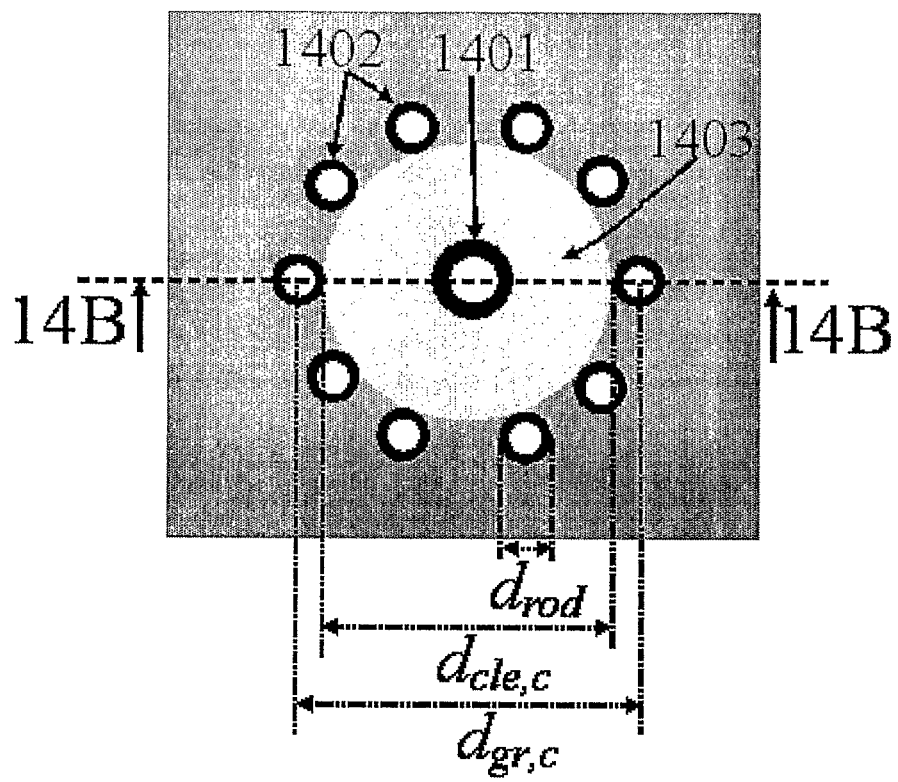
FIGS. 14A and 14B show top and cross-sectional views, respectively, of a via transmission line in a multilayer PCB having a circular arrangement of ground vias in an outer conductive boundary of the via transmission line and corresponding circular cross-sectional shape of a clearance hole with dimensions extended directly to the outer conductive surface of ground via rods.
Figure 14B:
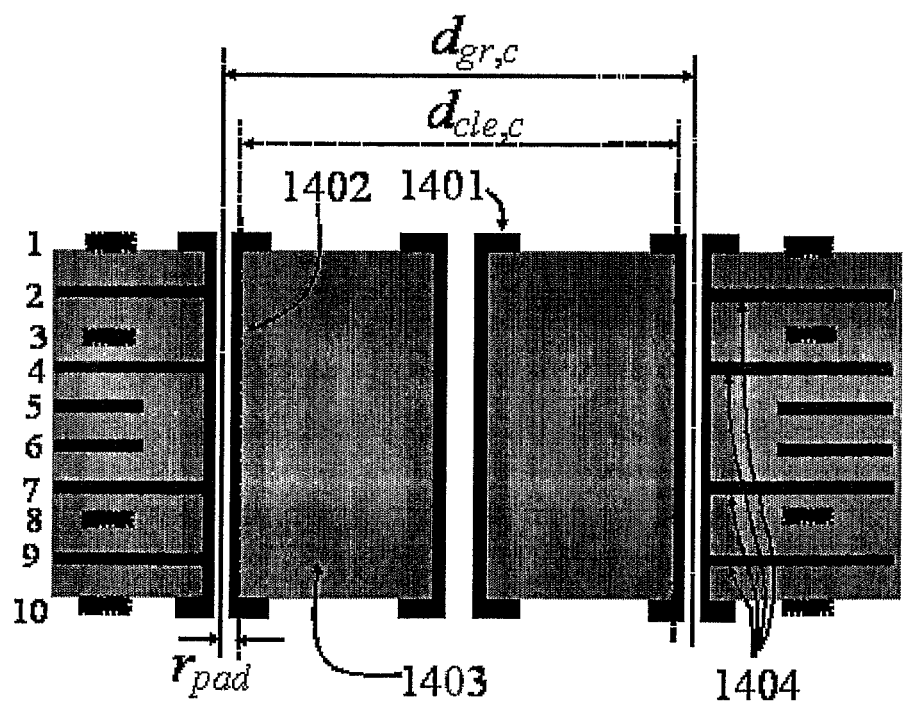

A via transmission line in a multilayer PCB including a circular arrangement of ground vias 1402, ground plates 1404, and a central signal via 1401 is demonstrated in FIG. 14. The radius of a clearance hole 1403 in this via transmission line is determined according to Equation 9 to provide a broadband operation of the via transmission line.

Figure 15A:
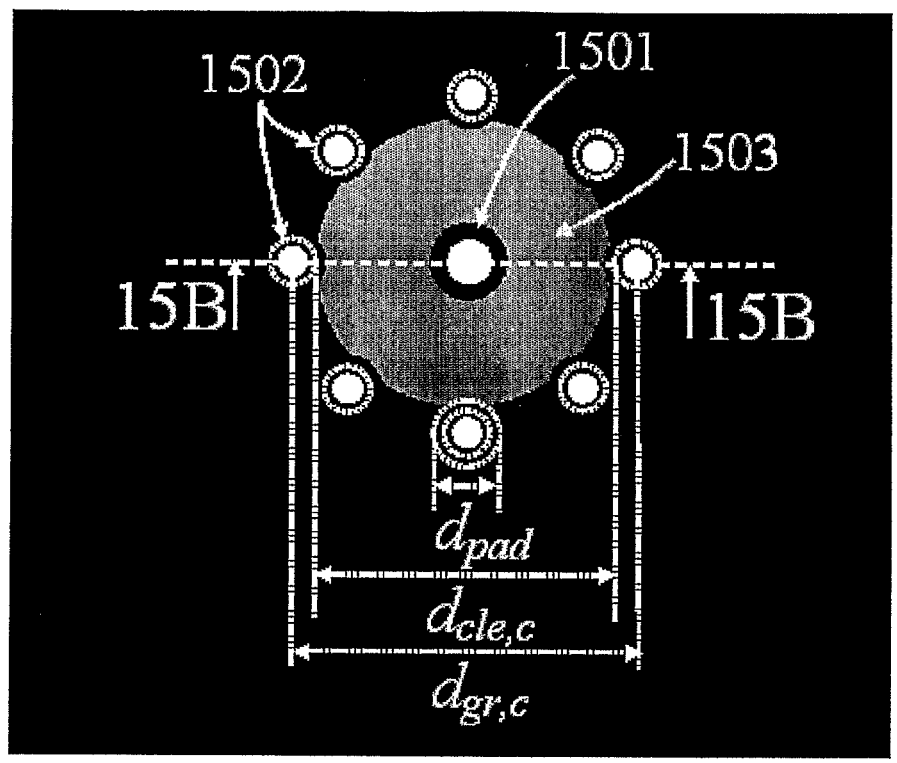
FIGS. 15A and 15B show top and cross-sectional views, respectively, of a via transmission line in a multilayer PCB having a circular arrangement of ground vias in an outer conductive boundary of the via transmission line and; corresponding circular cross-sectional shape of a clearance hole with dimensions extended directly to the outer conductive surface of ground via rods and, in addition, cylindrical ground via pads are formed around ground vias for dimensional tolerances of the ground via fabrication.
Figure 15B:
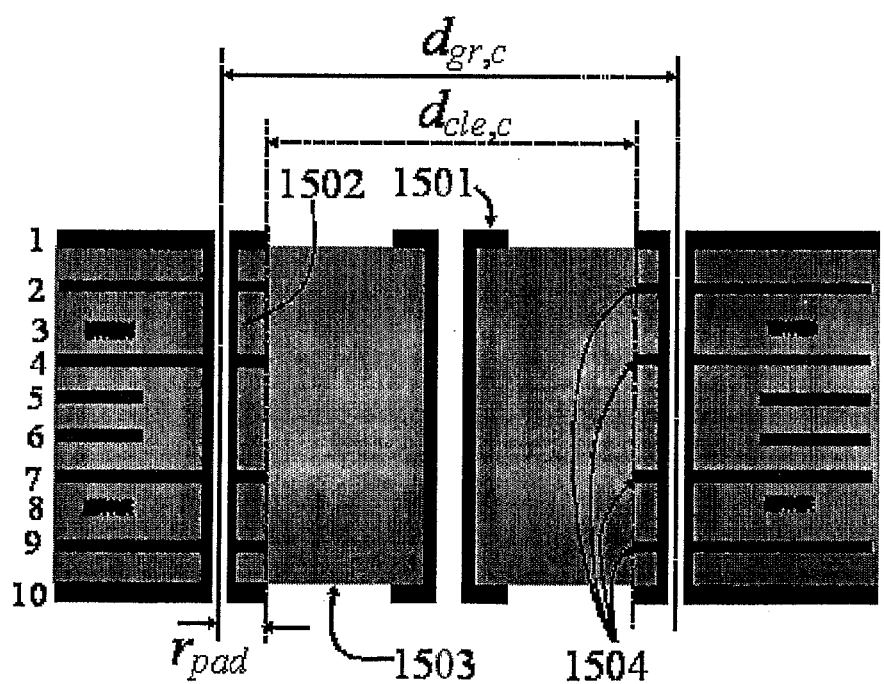

In FIG. 15, a via transmission line in a multilayer PCB is shown. This via transmission line consists of ground vias 1502 of a circular arrangement, ground plates 1504, a central signal via 1501, and a circular clearance hole 1503 for which the radius was determined according to Equation 9 and, in addition, cylindrical pads around ground vias 1502 are foreseen to provide full value connections of ground vias 1502 and ground plates 1504 taking into account dimensional tolerances of a via fabrication technology.

It is necessary to emphasize that above-mentioned methods applied to develop via transmission lines with elliptical, square and circular arrangements of ground vias in the outer conductive boundary and based on the approximate satisfaction of Equation 2 (that is a key point of the methods) provide the high-performance and broadband operation of the via transmission lines in a multilayer PCB. It is clear that these methods can be applied to develop via transmission lines with other arrangements of ground vias in the outer conductive boundary of via transmission lines.

Via transmission lines in a multilayer PCB can be used to join various interconnect circuits such as planar transmission lines (varieties of microstrip lines, striplines, coplanar waveguides, slotlines, and so on) embedded in the multilayer PCB, coaxial cables, bond wires, pins from Large-Scale Integration (LSI) chip packages, and so on.

Figure 16A:
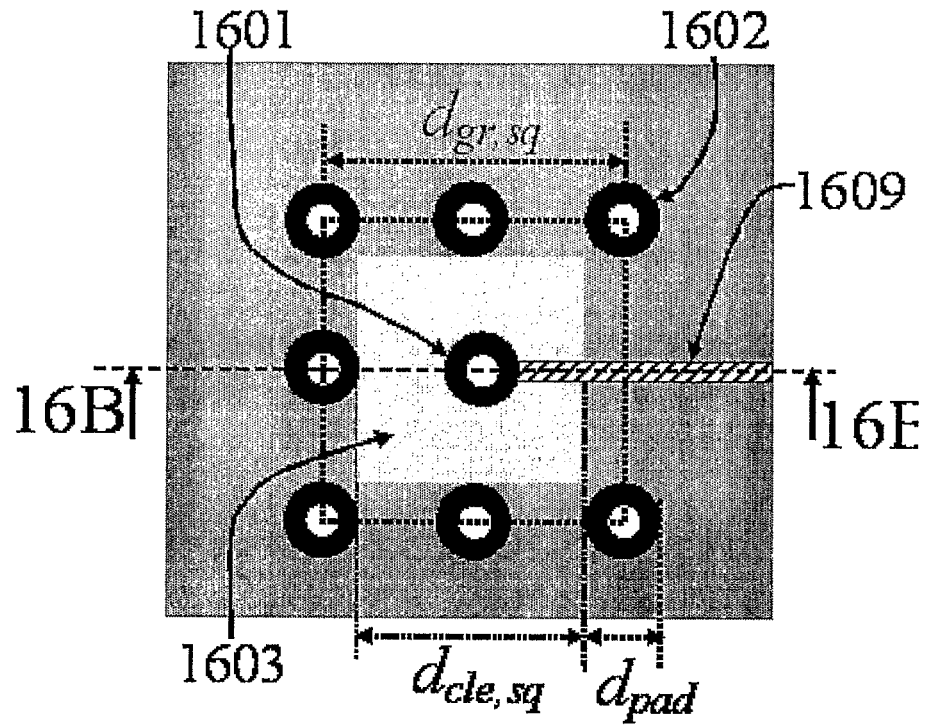
FIGS. 16A and 16B show top and cross-sectional views, respectively, of a transition in a multilayer PCB from a via transmission line having a square arrangement of ground vias and corresponding square cross-sectional shape of a clearance hole to a stripline.
Figure 16B:
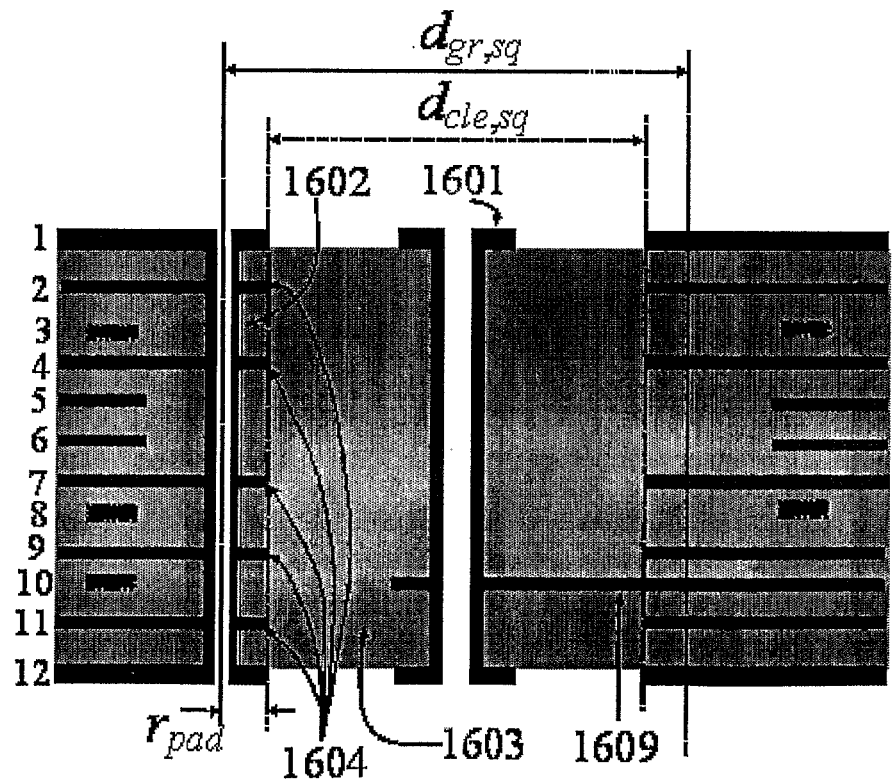

As an example, a transition from a via transmission line to a planar transmission line as a stripline in a twelve-conductor-layer PCB is shown in the FIG. 16. In this figure the via transmission line is formed by a signal via 1601 as an inner conductive boundary, ground vias 1602 of a square arrangement and ground plates 1604 from conductor layers of the PCB as an outer conductive boundary, and a clearance hole 1603 having a square cross-sectional shape according to the ground via 1602 arrangement and cross-sectional dimensions determined according to Equation 12 providing dimensional tolerances for full value connections of ground vias 1602 and ground plates 1604. The via transmission line is connected by means of a cylindrical pad to the stripline 1609 at the tenth conductor layer of the PCB.

Figure 17A:
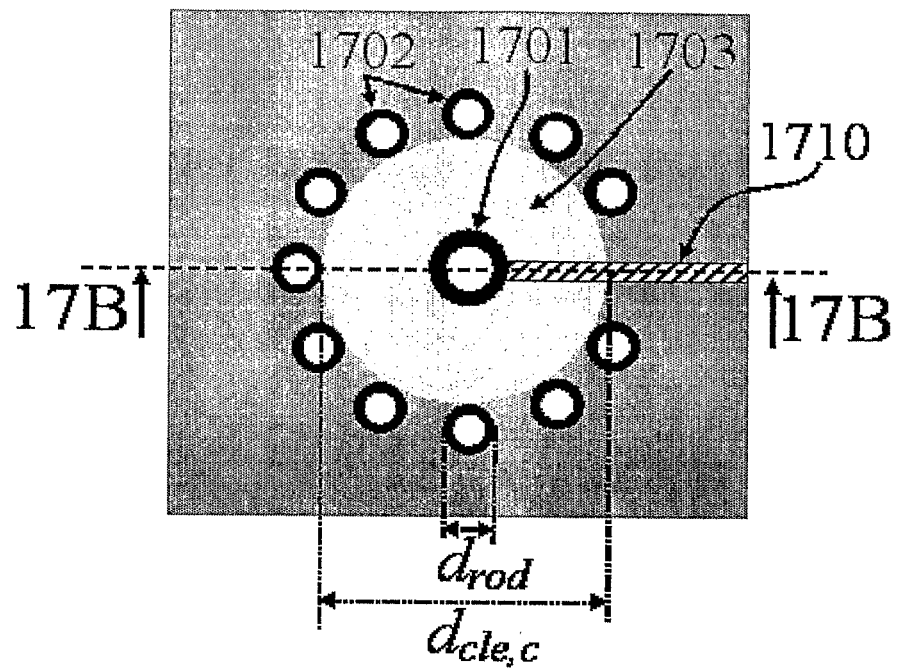
FIGS. 17A and 17B show top and cross-sectional views, respectively, of a transition in a multilayer PCB from a via transmission line having a circular arrangement of ground vias and corresponding circular cross-sectional shape of a clearance hole to a microstrip line.
Figure 17B:
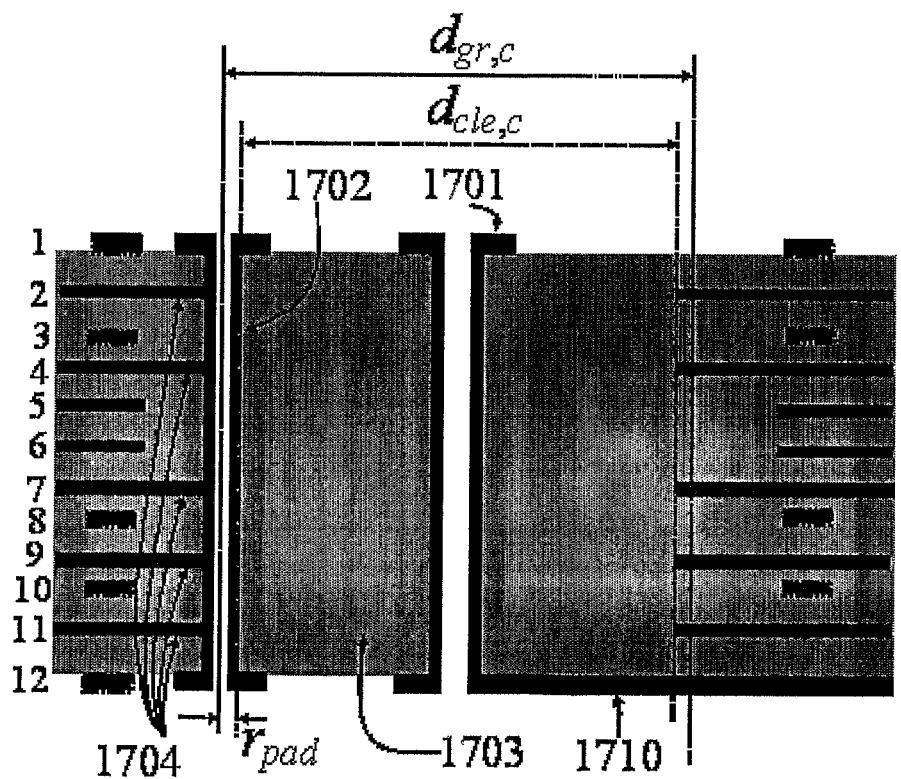

Another example of a transition from a via transmission line to a planar transmission line as a microstrip line in a twelve-conductor-layer PCB is demonstrated in FIG. 17. In this figure, the via transmission line is formed by a signal via 1701 as an inner conductive boundary, ground vias 1702 of a circular arrangement and ground plates 1704 from conductor layers of the PCB as an outer conductive boundary, and a clearance hole 1703 having a circular cross-sectional form corresponding to the ground via 1702 arrangement in the outer conductive boundary and the radius determined according to Equation 9 providing the broadband operation of the transition. The via transmission line is connected to the microstrip line 1710 at the twelfth conductor layer of the PCB.

Figure 18A:
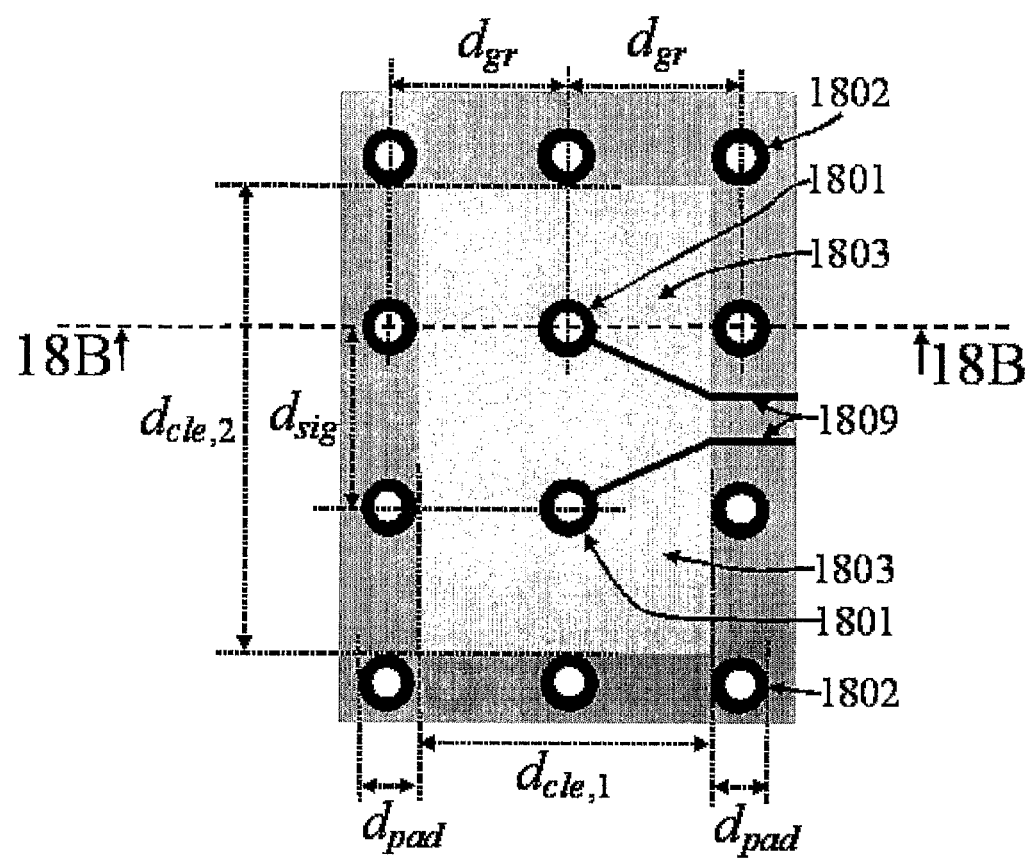
FIGS. 18A and 18B show a top and cross-sectional views, respectively, of a transition in a multilayer PCB from a via transmission line consisting of a coupled pair of signal vias, ground vias with a rectangular arrangement of ground vias and corresponding rectangular clearance hole to a coupled pair of striplines.
Figure 18B:
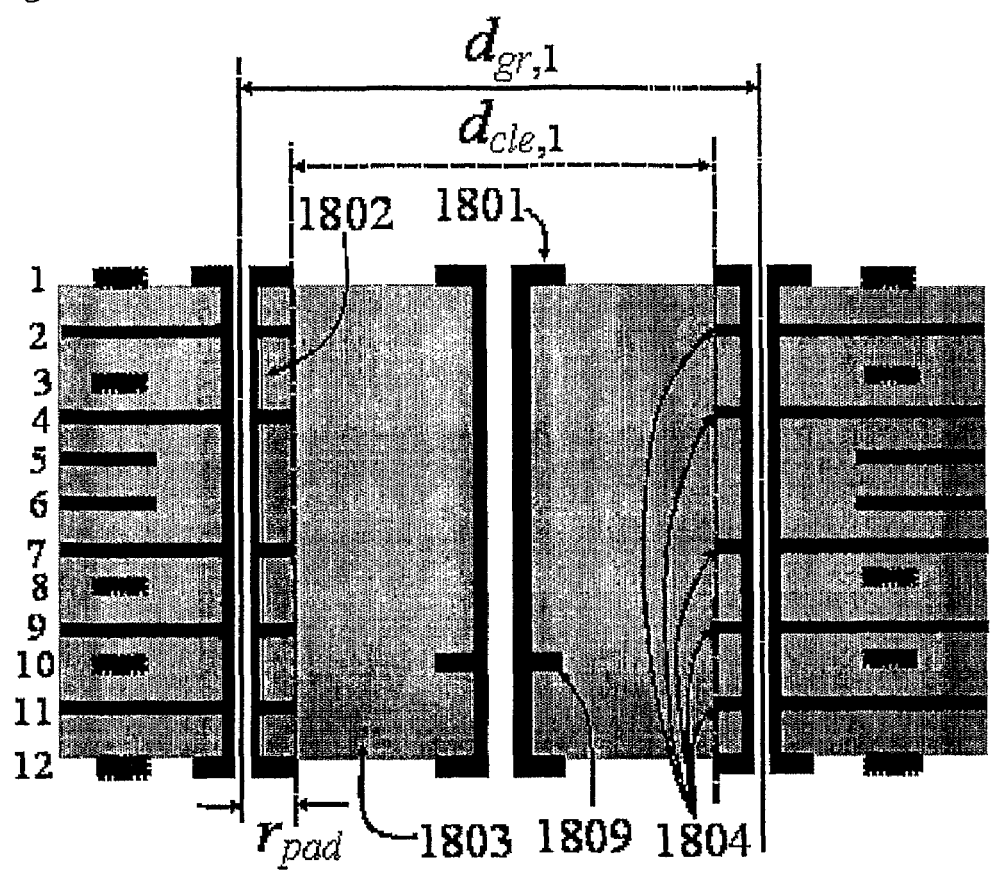

In FIG. 18, a type of transitions for differential signaling in a multilayer PCB including a via transmission line and a coupled pair of striplines is shown. This via transmission line consists of pair of signal vias 1801 as an inner conductive boundary, ground vias 1802 of a rectangular arrangement connected to ground plates 1804 forming an outer conductive boundary of the via transmission line, a clearance hole 1803 of the rectangular cross-sectional shape according to the ground via arrangement in the outer conductive boundary. The width and length of the clearance hole are determined by Equations 5 and 6 in which $d_{gr,1} = 2d_{gr}$ and $d_{gr,2} = 2d_{gr} + d_{sig}$ as shown in FIG. 18. The via transmission line is, connected to the pair of striplines 1809 at the tenth conductor layer of the multilayer PCB.

Figure 19A:
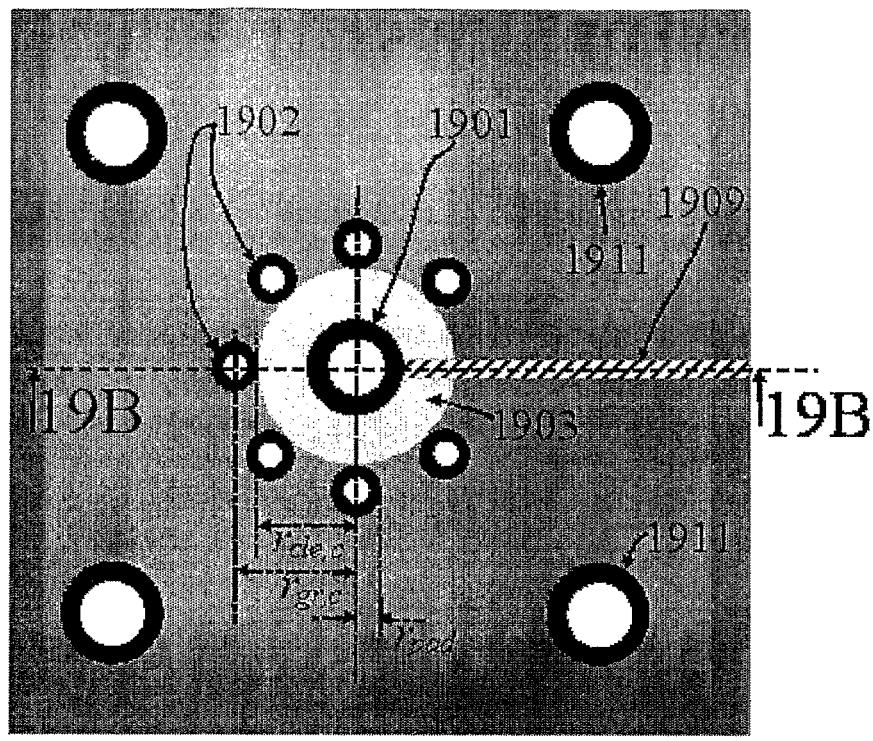
FIGS. 19A and 19B show top and cross-sectional views, respectively, of a transition in a multilayer PCB from a via structure under a sub-miniature-type-A (SMA) connector to a stripline including a via transmission line having a circular arrangement of ground vias and corresponding circular cross-sectional shape of a clearance hole.
Figure 19B:
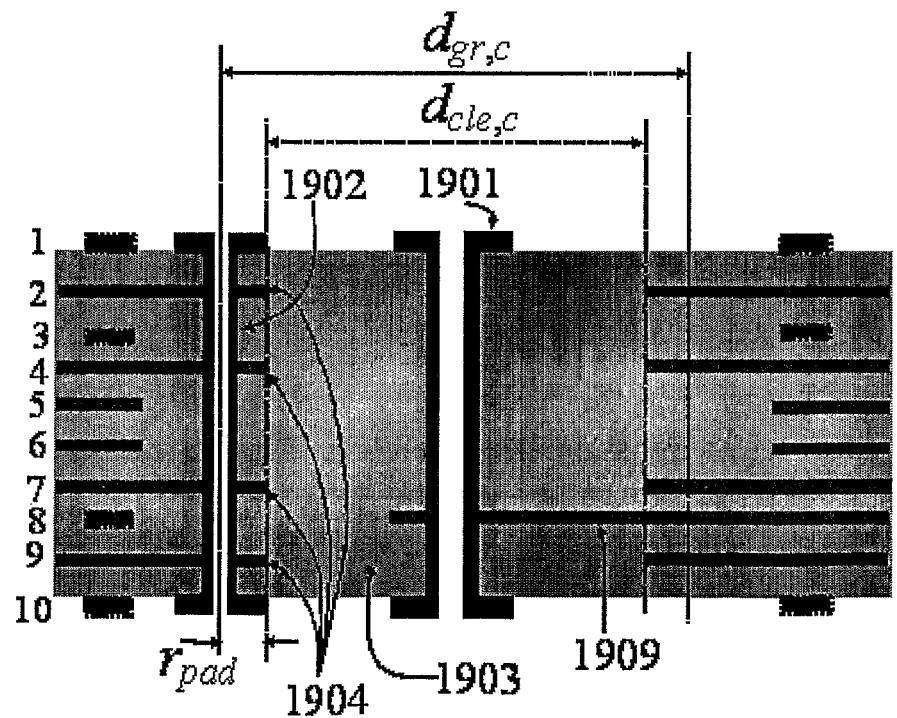

An example of an application of a via transmission line in a multilayer PCB is shown in FIG. 19, where a via structure under a connector, as for an example a sub-miniature-type-A (SMA) connector, is presented. The via structure under the connector includes a signal via 1901 and ground vias 1911. In the figure, a transition from the signal via 1901 to a stripline 1909 (as an example of planar transmission lines) at the eighth conductor layer is also shown. To obtain the higher performance of such type of via structures in the wide frequency band an advanced via structure including a via transmission line can be used. The via transmission line in this case can be formed by the signal via 1901 as an inner conductive boundary, ground vias 1902 of a circular arrangement (as an example of via arrangements in an outer conductive boundary of the via transmission line) and ground plates 1904 as an outer conductive boundary, a clearance hole having a circular cross-section according to the arrangement of ground vias 1902 and radius determined by Equation 10. Note that characteristic impedances of this via transmission line can be controlled by the distance to the outer conductive boundary of the via transmission line that can be used for matching to the characteristic impedance of the stripline 1909.

Figure 20A:
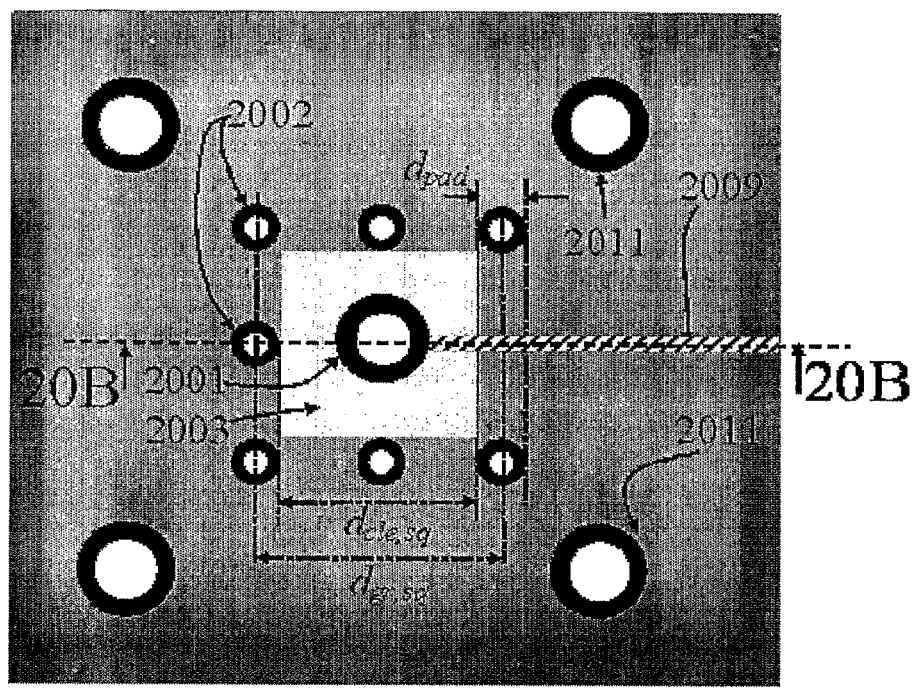
FIGS. 20A and 20B show top and cross-sectional views, respectively, of a transition in a multilayer PCB from a via structure under a sub-miniature-type-A (SMA) connector to a stripline including a via transmission line having a square arrangement of ground vias and corresponding square cross-sectional shape of a clearance hole.
Figure 20B:
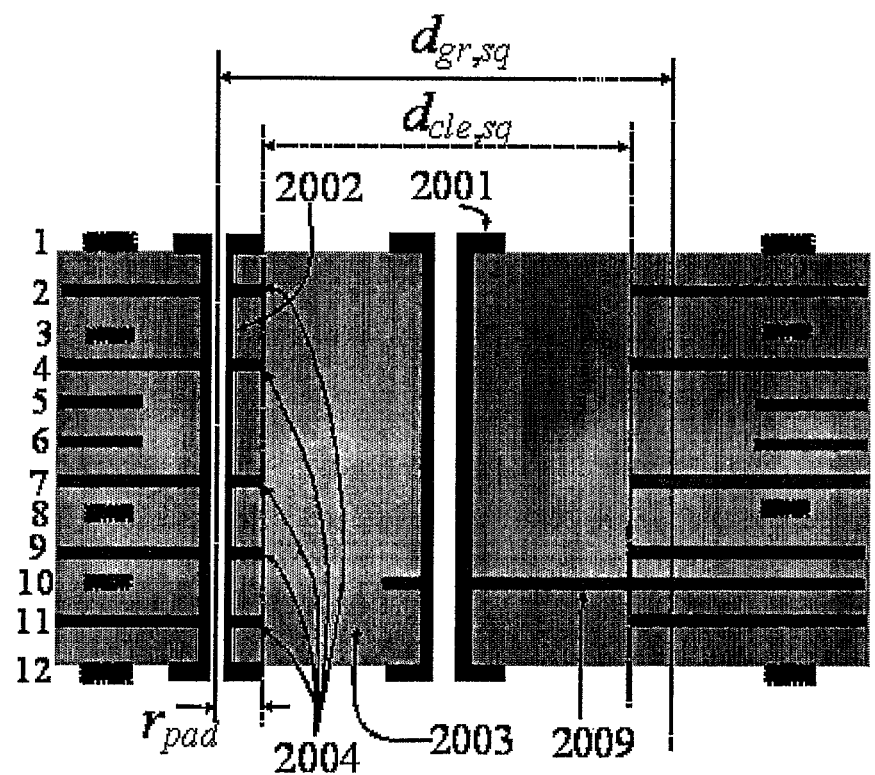

The same type of via structures under the SMA connector including a signal via 2001 and ground vias 2011 and jointed to a stripline 2009 is shown in FIG. 20. However, in this case to improve the electrical performance of a via structure under the SMA connector a via transmission line with another type of ground via arrangements in an outer conductive boundary is formed. This via transmission line embedded in a multilayer PCB consists of the signal via 2001, ground vias 2002 of a square arrangement, ground plates 2004 from conductor layers of the multilayer PCB, and a clearance hole 2003 of the square cross-sectional shape according to the arrangement of ground vias 2002 and dimensions of the clearance hole determined by Equation 12.

Presented via transmission lines were developed on the base of plated-through holes as signal vias. However, the same methods to form a via transmission line can be applied to other signal via structures, as for an example to blind vias, or buried vias, or counter-bored vias.

Figure 21A:
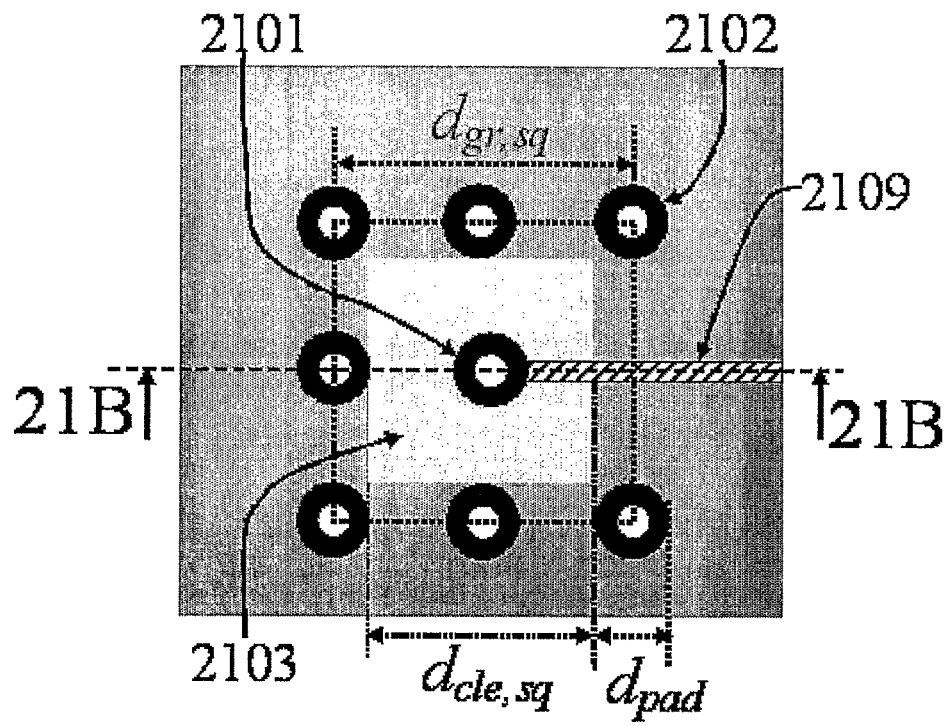
FIGS. 21A and 21B show top and cross-sectional views, respectively, of a transition in a multilayer PCB from a via transmission line to a stripline where the via transmission line includes a signal blind via.
Figure 21B:
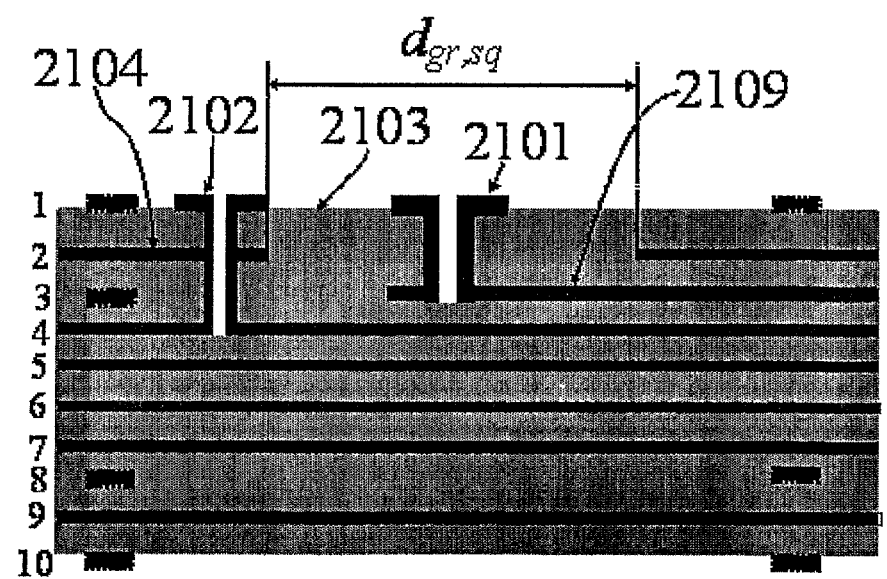

In FIG. 21, a transition from a signal blind via 2101 to a stripline 2109 in a multilayer PCB is shown. A via transmission line for the transition is formed by a blind signal via 2101 as an inner conductive boundary, ground vias 2102 with a square arrangement which form an outer conductive boundary of the via transmission line jointly with ground plate 2104. The cross-sectional shape of the clearance hole 2103 in the via transmission line is square one according to the square arrangement of ground vias in the outer conductive boundary and dimensions of the clearance hole were determined according to Equation 12 providing dimensional tolerances for full value ground via and ground plate connections.

Figure 22A:
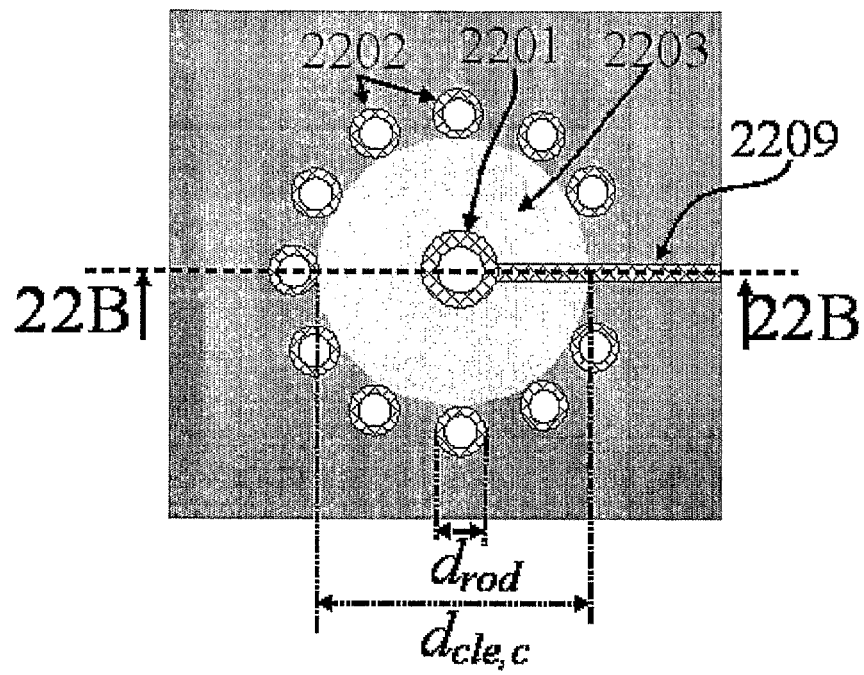
FIGS. 22A and 22B show top and cross-sectional views, respectively, of a transition in a multilayer PCB between striplines placed at different signal layers of the multilayer PCB including a via transmission line developed on the base of a buried signal via.
Figure 22B:
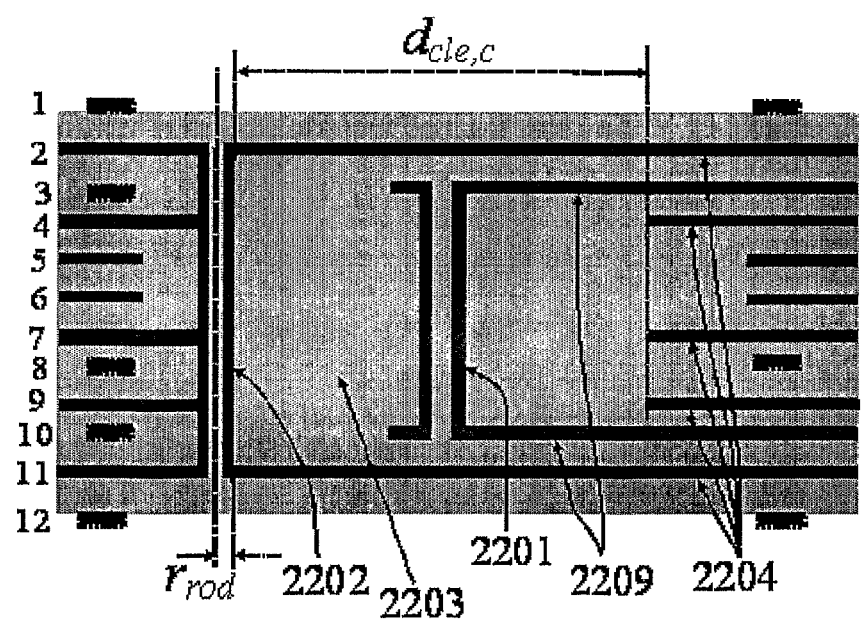

In FIG. 22, a via transmission line in a multilayer PCB including a buried signal via 2201 connecting two striplines 2209 placed at different signal conductor layers of the multilayer PCB is shown. The via transmission line is formed by the buried signal via 2201 as an inner conductive boundary, ground vias 2202 arranged in a circular form and ground plates 2204 connected to ground vias 2202 as an outer conductive boundary, and the clearance hole 2203 having a circular cross-sectional shape according to the arrangement of ground vias 2202 and the radius determined according to Equation 9.

To show advantages of via transmission lines in the electrical performance, some results of simulations of the high-speed signal propagation in via structures are presented here. The results include magnitudes of the S-parameters and leakage losses against frequency calculated by the finite-difference time-domain (FDTD) algorithm, which is one of the most accurate numerical methods to characterize three-dimensional interconnection circuits.

Figure 23A:
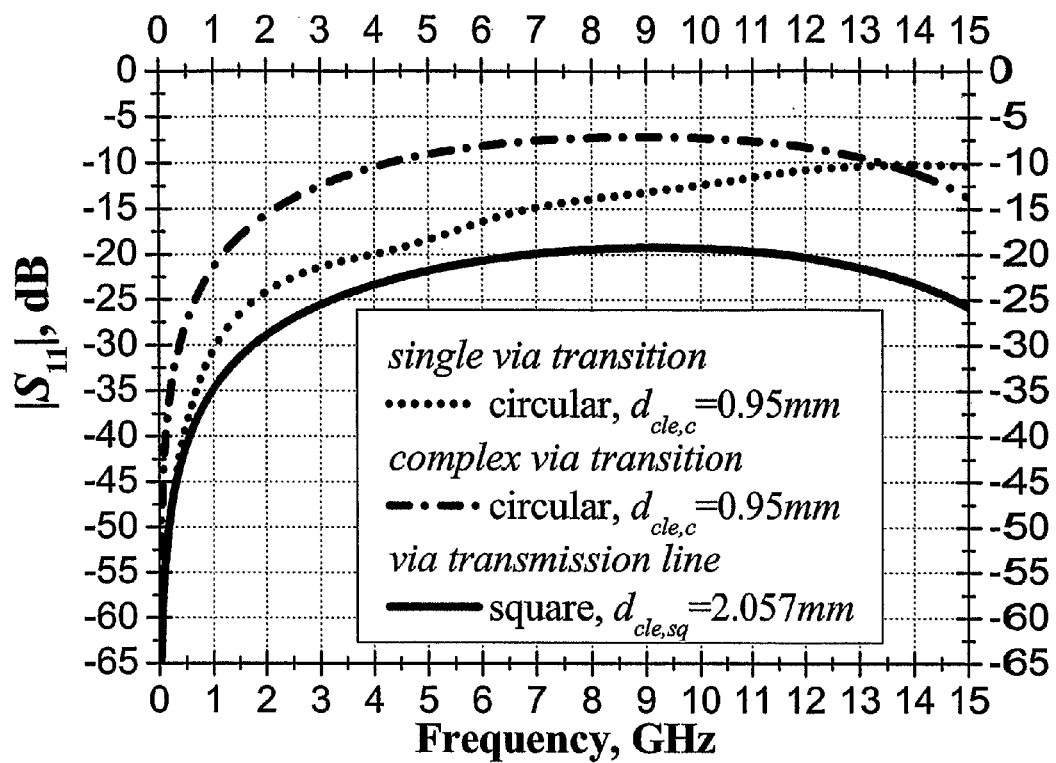
FIGS. 23A, 23B and 23C show simulation results of magnitudes of S-parameters for a transition in a 12-conductor layer PCB from 50 ohms coaxial cable at the top layer of the PCB by means of a via structure to another 50 ohms coaxial cable at the bottom layer of the PCB, where the via structure was used in turn as a single signal via, or a complex via structure, or a via transmission line.
Figure 23B:
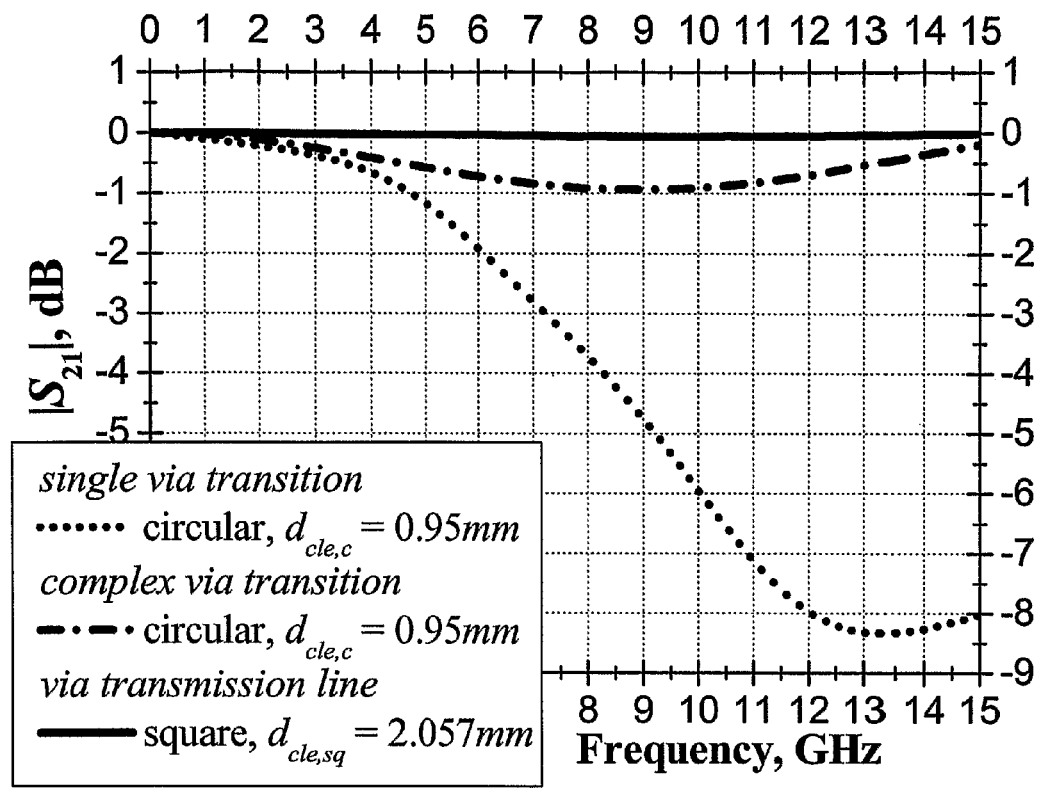

In FIGS. 23A and 23B, magnitudes of S-parameters for a transition in a 12-conductor layer PCB from 50 ohms coaxial cable at the top layer of the PCB by means of a via structure to another 50 ohms coaxial cable at the bottom layer of the PCB are shown in the frequency band up to 15 GHz. This via structure was presented in turn by a single signal via, a complex via structure consisting of signal and ground vias, and a via transmission line.

The via transmission line was formed by a signal via (central conductor), eight ground vias of a square arrangement, plates from ground layers, and a clearance hole having corresponding square shape determined according to the arrangement of ground vias and dimensions determined according to Equation 11. Geometry of the via transmission line and the 12-conductor-layer PRCB used in simulations is shown in FIG. 7. Dimensions of the signal via and eight ground vias in simulations were as follows: Signal via and ground via rod diameters, $d_{rod}$, were 0.5 mm, the distance between ground vias, $d_{gr,sq}$, was 2.557 mm and pad diameters in the signal via were equal to 0.8 mm. The side of the square clearance hole in the via transmission line, $d_{ole,sq}$, was 2.057 mm. The 12-conductor-layer PCB (see FIG. 7) had thickness of 2.5 mm filled with a FR-4 isolating dielectric of the relative permittivity of 4.2 (in simulations the dielectric was considered as lossless one).

The complex via structure used in the transition had the same arrangement and dimensions of the signal via and ground vias but was differing from the via transmission line by the cross-sectional shape and dimensions of the clearance hole. In the case of the complex via structure the clearance hole was a circular cross-section with the diameter of $d_{ole,c}$=95 mm.

The single signal via in calculations had the same dimensions as the signal via in above-mentioned via structures but only ground vias were removed for this via structure and the diameter of the circular clearance was as follows: $d_{ole,c}$=0.95 mm.

Figure 23C:
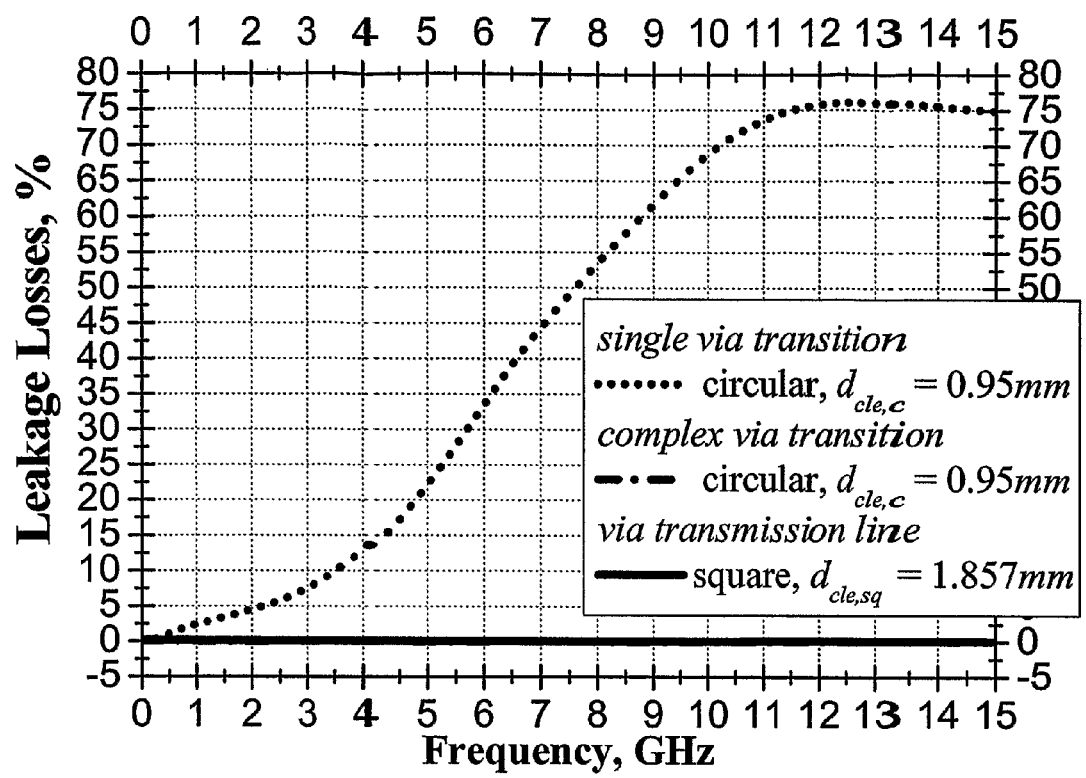

Also, in FIG. 23C leakage losses in percent for these three via structures were presented. Leakage losses were calculated by means of S-parameters according to following formula:

$$\text{Leakage Losses, [\%]} = 100 \cdot (1 - |S_{11}|^2 - |S_{21}|^2). \quad (13)$$

FIGS. 23A, 23B and 23C show that considered via structures are characteristically different in the electrical performance. The via transmission line has clear preferences over other two types of via structures due to its low return, ($|S_{11}|$-parameter) and leakage losses.

Figure 24A:
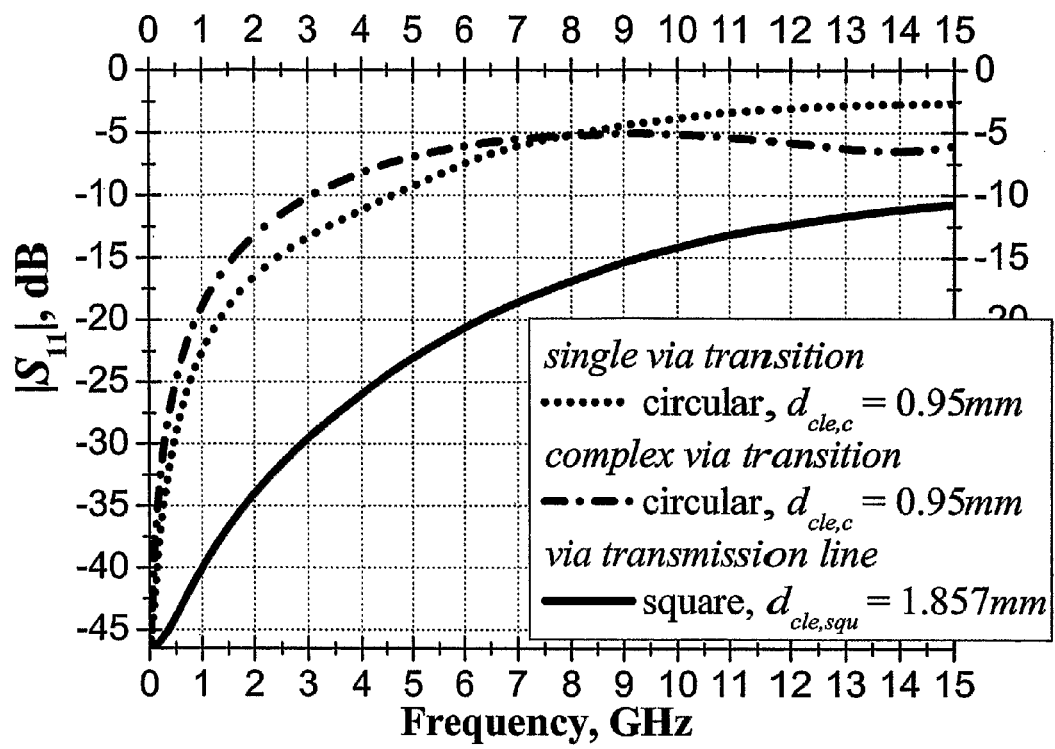
FIGS. 24A, 24B and 24C show simulation results of magnitudes of S-parameters for a transition in a 12-conductor layer PCB from 50 ohms coaxial cable at the top (first) layer of the PCB by means of a via structure to a 50 ohms stripline placed at the tenth layer of the PCB, where the via structure was used in turn as a single signal via, or a complex via structure, or a via transmission line.
Figure 24B:
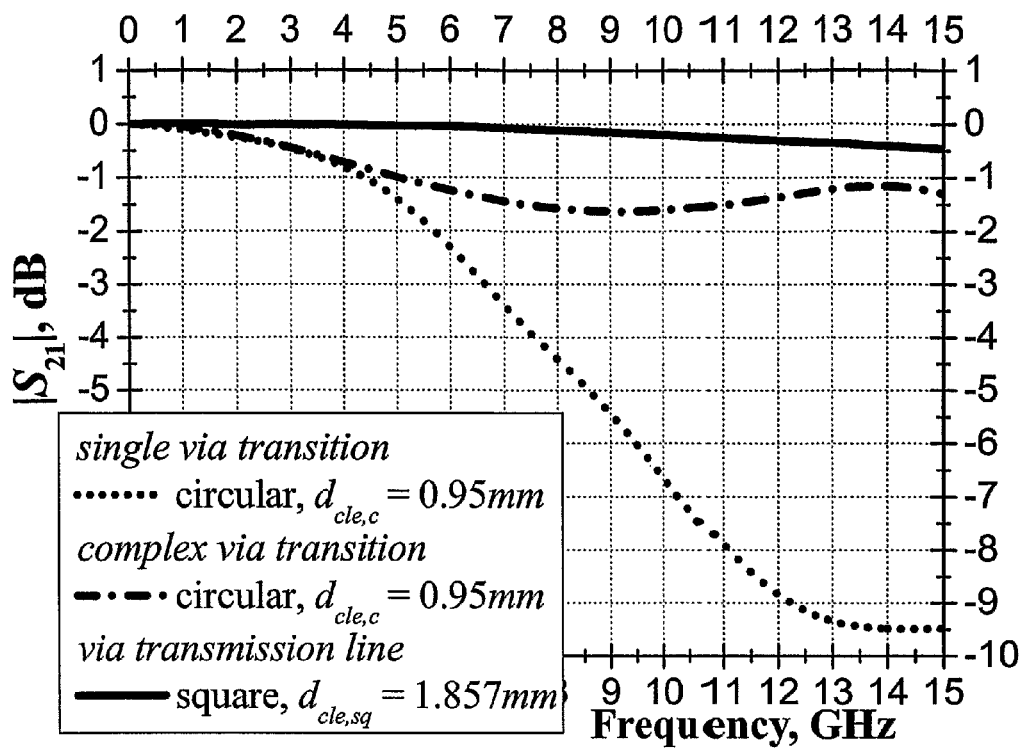

In FIGS. 24A and 24B, magnitudes of S-parameters for another type of interconnect circuits in the same 12-conductor-layer PCB care presented. This type consists of a transition from a 50 ohms coaxial cable at the top (first) layer of the PCB by means of a via structure to a 50 ohms stripline placed at the tenth conductor layer of the PCB. Again, the via structure was presented in turn by a single signal via, a complex via structure consisting of signal and ground vias, and a via transmission line.

The via transmission line was formed by a signal via (central conductor), seven ground vias of a square arrangement, plates from ground layers, and a clearance hole having corresponding square shape determined according to the arrangement of ground vias and dimensions determined according to Equation 12 where the diameter of ground via pad, $d_{pad}$, taking into account dimensional tolerances for the ground via fabrication was 0.7 mm. The via transmission line in the 12-conductor-layer PCB and its connection to the stripline is similar to that in FIG. 16. All dimensions of this via transmission line were the same as in FIGS. 23A, 23B and 23C.

The complex via structure with a clearance hole of a circular cross-section and the radius of $d_{ole,c}$=0.95 mm used in the transition from the coaxial cable to the stripline had the same arrangement and dimensions of the signal via and ground vias as the via transmission line.

The single signal via with a clearance hole as in the complex via structure in the transition from the coaxial cable to the stripline had the same dimensions as the signal via in the via transmission line and the complex via structure but only ground vias were removed for this via structure.

Figure 24C:
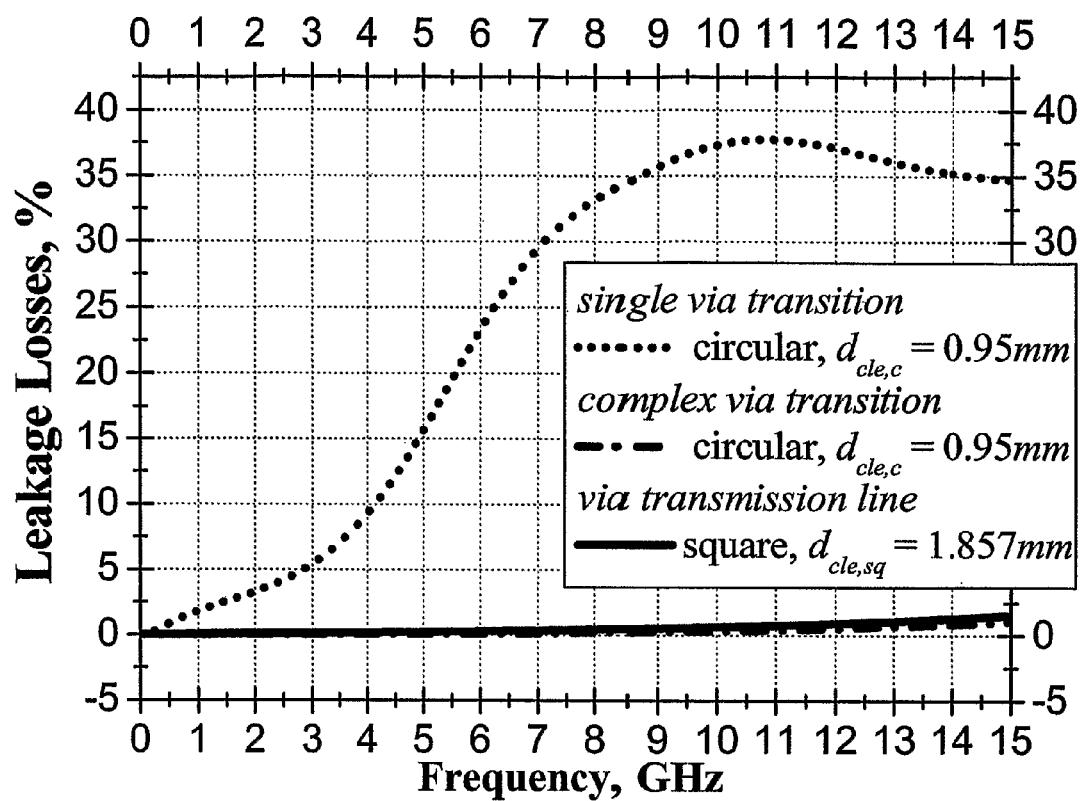

In FIG. 24C, leakage losses in percent for these three types of interconnect structures were presented.

As in FIGS. 23A, 23B and 23C, FIGS. 24A, 24B and 24C demonstrate pronounced preferences of the via transmission line over other two types of via structures.

As a conclusion, via transmission lines can considerably improve the electrical performance of interconnect circuits developed on the base of multilayer PCBs.

Also it is necessary to emphasize that via transmission lines can be used for development of complex high-density via structures in a multilayer PCB.

The invention claimed is:

1. A via transmission line for a multilayer PCB comprising:
   one or more signal vias acting as inner conductive boundary of the via transmission line;
   an assembly of ground vias and a set of ground plates from conductor layers of the PCB where the ground vias are connected to the ground plates, and the assembly of the ground vias and the set of ground plates act as the outer conductive boundary of the via transmission line; and
   a PCB isolating material disposed between the inner and outer conductive boundaries of the via transmission line, the PCB isolating material having a cylindrical clearance hole separating the one or more signal vias and conductive parts of the outer conductive boundary of the via transmission line, wherein the cylindrical clearance hole establishes a broadband operation by means of its cross-sectional shape and dimensions which are determined, wherein a contour of the outer cross-sectional shape of the clearance hole corresponds to an arrangement of ground vias in the outer conductive boundary and dimensions of the clearance hole extend directly to an outer conductive surface of a ground via rod keeping the full value connections of ground vias and ground plates.

2. A via transmission line for a multilayer PCB according to claim 1, wherein:
   dimensions of the clearance hole are extended to the ground via centers minus the radius of the pad for the ground via determined by dimensional tolerances of an applied via fabrication technology in the multilayer PCB for full value connections of the ground vias and the ground plates.

3. A via transmission line for a multilayer PCB according to claim 1, wherein:
   dimensions of the clearance hole are determined as extended directly to the outer conductive surface of the ground via rod and, in addition, cylindrical pads are formed around ground vias for full value connections of ground vias and ground plates taking into account dimensional tolerances of a via fabrication technology in the multilayer PCB.

4. A via transmission line for a multilayer PCB according to claim 1, wherein:
   the clearance hole has circular cross-sectional shape with the radius determined as the distance from the center of the via transmission to conductive surface of the nearest ground via rod.

5. A via transmission line for a multilayer PCB according to claim 1, wherein:
   the clearance hole has circular cross-sectional shape with the radius determined as the distance from the center of the via transmission line via to the nearest ground via center minus the radius of the cylindrical pad for the ground via determined by dimensional tolerances of a via fabrication technology in the multilayer PCB for full value connections of the ground vias and the ground plates.

6. A via transmission line for a multilayer PCB according to claim 1, wherein:
   the clearance hole has circular cross-sectional shape with the radius determined as the distance from the center of the via transmission line to a conductive surface of the nearest ground via rod and, in addition, cylindrical pads are formed around the ground vias determined by dimensional tolerances for full value connections of the ground vias and the ground plates according to a via fabrication technology in the multilayer PCB.

7. A via transmission line for a multilayer PCB according to claim 1, wherein:
   the distance between neighboring ground vias in the outer conductive boundary of the via transmission line is less than $\lambda/8$ or equal to $\lambda/8$, where $\lambda$ is taken as the shortest wavelength in the isolation material of the multilayer PCB at the predetermined frequency range.

8. A via transmission line for a multilayer PCB comprising:
   pair of signal vias acting as an inner conductive boundary of the via transmission line;
   an assembly of ground vias of an elliptical arrangement and a set of ground plates from conductor layers of the PCB where the ground vias are connected to the ground plates, and the assembly of the ground vias and the set of ground plates act as an outer conductive boundary of the via transmission line; and
   a cylindrical clearance hole of the elliptical cross-sectional shape according to the arrangement of the ground vias in the outer conductive boundary and dimensions extended directly to a outer conductive surface of a ground via rod keeping the full value connections of ground vias and ground plates.

9. A via transmission line for a multilayer PCB according to claim 8, wherein:
   dimensions of the elliptical clearance hole are extended to the ground via centers minus the radius of the cylindrical pad for the ground via determined by dimensional tolerances of a via fabrication technology in the multilayer PCB for full value connections of the ground vias and the ground plates.

10. A via transmission line for a multilayer PCB according to claim 8, wherein:
    dimensions of the elliptical clearance hole are determined as extended directly to the outer conductive surface of the ground via rods and, in addition, cylindrical pads are formed around ground vias for full value connections of ground vias and ground plates taking into account dimensional tolerances of a via fabrication technology in the multilayer PCB.

11. A via transmission line for a multilayer PCB according to claim 8, wherein:
    the distance between neighboring ground vias in the outer conductive boundary of the via transmission line with an elliptical arrangement is less than $\lambda/8$ or equal to $\lambda/8$, where $\lambda$ is taken as the shortest wavelength in the isolation material of the multilayer PCB at the predetermined frequency range.

12. A via transmission line for a multilayer PCB comprising:
- a signal via acting as an inner conductive boundary of the via transmission line;
- an assembly of ground vias of a square arrangement and a set of ground plates from ground layers of the multilayer PCB, where the ground vias are connected to the ground plates, and the assembly of the ground vias and the set of ground plates act as an outer conductive boundary of the via transmission line; and
- a cylindrical clearance hole having a square cross-sectional form according to the ground via arrangement and establishing a broadband operation of the via transmission line by means of its cross-sectional shape and dimensions extended directly to an outer conductive surface of a ground via rod keeping the full value connections of ground vias and ground plates.

13. A via transmission line for a multilayer PCB according to claim 12, wherein:
- dimensions of the clearance hole are extended to the ground via centers minus the radius of the pad for the ground via determined by dimensional tolerances of a via fabrication technology in the multilayer PCB for full value connections of the ground vias and the ground plates.

14. A via transmission line for a multilayer PCB according to claim 12, wherein:
- dimensions of the clearance hole are determined as extended directly to the outer conductive surface of the ground via rod and, in addition, cylindrical pads are formed around each ground via for full value connections of ground vias and ground plates taking into account dimensional tolerances of a via fabrication technology in the multilayer PCB.

15. A via transmission line for a multilayer PCB according to claim 12, wherein:
- a clearance hole has a circular cross-sectional shape with the radius determined as the distance from the center of the signal via to an outer conductive surface of the nearest ground via rod.

16. A via transmission line for a multilayer PCB according to claim 12, wherein:
- a clearance hole has a circular cross-sectional shape with the radius determined as the distance from the center of the signal via to the nearest ground via center minus the radius of the cylindrical pad for the ground via determined by dimensional tolerances of a via fabrication technology in the multilayer PCB for full value connections of the ground vias and the ground plates.

17. A via transmission line for a multilayer PCB according to claim 12, wherein:
- a clearance hole has a circular cross-sectional shape with the radius determined as the distance from the center of the signal via to conductive surface of the nearest ground via rod and, in addition, cylindrical pads are formed around the ground vias determined by dimensional tolerances for full value connections of the ground vias and the ground plates according to a via fabrication technology in the multilayer PCB.

18. A via transmission line for a multilayer PCB according to claim 12, wherein:
- the distance between neighboring ground vias in the outer conductive boundary of the via transmission line with a square arrangement is less than $\lambda/8$ or equal to $\lambda/8$, where $\lambda$ is taken as the shortest wavelength in the isolation material of the multilayer PCB at the predetermined frequency range.

19. A via transmission line for a multilayer PCB comprising:
- a signal via acting as inner conductive boundary of the via transmission line;
- an assembly of ground vias of a circular arrangement and a set of ground plates from ground layers of the PCB where the ground vias are connected to the ground plates, and the assembly of the ground vias and the set of ground plates act as an outer conductive boundary of the via transmission line; and
- a cylindrical clearance hole having circular cross-sectional shape, establishing a broadband operation of the via transmission line by means of its cross-sectional dimensions extended directly to an outer conductive surface of a ground via rod keeping the full value connections of ground vias and ground plates.

20. A via transmission line for a multilayer PCB according to claim 19, wherein:
- dimensions of the circular clearance hole are extended to the ground via centers minus the radius of the pad for the ground via determined by dimensional tolerances of a via fabrication technology in the multilayer PCB for full value connections of the ground vias and the ground plates.

21. A via transmission line for a multilayer PCB according to claim 19, wherein:
- dimensions of the clearance hole are determined as extended directly to the outer conductive surface of the ground via rod and, in addition, the circular cylindrical pads are formed around ground vias for full value connections of ground vias and ground plates taking into account dimensional tolerances of a via fabrication technology in the multilayer PCB.

22. A via transmission line for a multilayer PCB according to claim 19, wherein:
- the distance between neighboring ground vias in the outer conductive boundary of the via transmission line with a circular arrangement is less than $\lambda/8$ or equal to $\lambda/8$, where $\lambda$ is taken as the shortest wavelength in the isolation material of the multilayer PCB at the predetermined frequency range.

23. A via transmission line for a multilayer PCB comprising:
- pair of signal vias acting as an inner conductive boundary of the via transmission line;
- an assembly of ground vias of rectangular arrangement and a set of ground plates from ground layers of the PCB where the ground vias are connected to the ground plates, and the assembly of the ground vias and the set of ground plates act as an outer conductive boundary of the via transmission line; and
- a cylindrical clearance hole of a rectangular cross-sectional shape disposing between inner and outer conductive boundaries of the via transmission line and establishing a broadband operation of the via transmission line by means of its dimensions which are extended directly to the outer conductive surface of the ground via rods keeping the full value connections of ground vias and ground plates.

24. A via transmission line for a multilayer PCB according to claim 23, wherein:
- dimensions of the rectangular clearance hole are extended to the ground via centers minus the radius of the pad for the ground via determined by dimensional tolerances of a via fabrication technology in the multilayer PCB for full value connections of the ground vias and the ground plates.

25. A via transmission line for a multilayer PCB according to claim 23, wherein:
dimensions of the rectangular clearance hole are determined directly to the outer conductive surface of the ground via rods and, in addition, the cylindrical pads are formed around ground vias for full value connections of ground vias and ground plates taking into account dimensional tolerances of a via fabrication technology in the multilayer PCB.

26. A via structure under a connector including a subminiature-type-A (SMA) connector in a multilayer PCB comprising:
a signal via for a signal pin of the connector;
a number of ground vias for ground pins of the connector; and
a via transmission line formed by the signal via acting as an inner conductive boundary of the via transmission line, an assembly of ground vias surrounding the signal via, a set of ground plates from conductor layers of the PCB, where the assembly of ground vias and the set of ground plates act as an outer conductive boundary of the via transmission line, a PCB isolating material disposed between inner and outer conductive boundaries of the via transmission line and separating the signal via and conductive parts of the outer conductive boundary of the via transmission line, the PCB isolating material having a clearance hole,
establishing a broadband operation of the via transmission line by means of its cross-sectional shape and dimensions which are determined, wherein a contour of the outer cross-sectional shape of the clearance hole corresponds to an arrangement of ground vias in the outer conductive boundary of the via transmission line and dimensions of the clearance hole extend directly to an outer conductive surface of a ground via rod keeping the full value connections of ground vias and ground plates.

27. A via structure under a connector including a subminiature-type-A (SMA) connector in a multilayer PDB according to claim 26 wherein:
dimensions of the clearance hole of the via transmission line are extended to the ground via centers minus the radius of the pad for the ground via determined by dimensional tolerances of a via fabrication technology in the multilayer PCB for full value connections of the ground vias and the ground plates.

28. A via structure under a connector including a subminiature-type-A (SMA) connector in a multilayer PCB according to claim 26, wherein:
dimensions of the clearance hole of the via transmission line are determined as extended directly to the outer conductive surface of the ground via rod and, in addition, cylindrical pads are formed around ground vias for full value connections of ground vias and ground plates taking into account dimensional tolerances of a via fabrication technology in the multilayer PCB.

29. A via structure under a connector including a subminiature-type-A (SMA) connector in a multilayer PCB according to claim 26, wherein:
a clearance hole of the via transmission line has circular cross-sectional shape with the radius determined as the distance from the center of the signal via to conductive surface of the rod of the nearest ground vias from the outer conductive boundary of the via transmission line.

30. A via structure under a connector including a subminiature-type-A (SMA) connector in a multilayer PCB according to claim 26, wherein:

a clearance hole of the via transmission line has circular cross-sectional shape with the radius determined as the distance from the center of the via transmission line via to the nearest ground via center from the outer conductive boundary of the via transmission line minus the radius of the cylindrical pad for the ground via determined by dimensional tolerances of a via fabrication technology in the multilayer PCB for full value connections of the ground vias and the ground plates.

31. A via structure under a connector including a subminiature-type-A (SMA) connector in a multilayer PCB according to claim 26, wherein:
a clearance hole of the via transmission line has circular cross-sectional shape with the radius determined as the distance from the center of the signal via to an outer conductive surface of the ground via rod of the nearest ground via from the outer conductive boundary of the via transmission line and, in addition, cylindrical pads are formed around ground vias determined by dimensional tolerances for full value connections of the ground vias and the ground plates determined by a via fabrication technology in the multilayer PCB.

32. A via structure under a connector including a subminiature-type-A (SMA) connector in a multilayer PCB according to claim 26, wherein:
the distance between neighboring ground vias in the outer conductive boundary of the via transmission line is less than $\lambda/8$ or equal to $\lambda/8$, where $\lambda$ is taken as the shortest wavelength in the isolation material of the multilayer PCB at the predetermined frequency range.

33. A transition from a signal via in the form of at least one of a plated-through hole, a blind via, a buried via, and a counter-bored via to a planar transmission line embedded in a multi layer PCB comprising:
a signal via;
a planar transmission line connected to the signal via by means of a cylindrical pad foreseen for a full value connection of the signal via and the planar transmission line; and
a via transmission line formed by the signal via acting as an inner conductive boundary of the via transmission line, an assembly of ground vias surrounding the signal via, a set of ground plates from conductor layers of the multilayer PCB where the assembly of ground vias and the set of ground plates act as an outer conductive boundary of the via transmission line, a PCB isolating material disposed between inner and outer conductive boundaries of the via transmission line and separating the signal via and conductive parts of the outer conductive boundary of the via transmission line, the PCB isolating material having a clearance hole establishing a broadband operation of the via transmission line by means of its cross-sectional shape and dimensions which are determined, wherein a contour of the outer cross-sectional shape of the clearance hole corresponds to an arrangement of ground vias in the outer conductive boundary of the via transmission line and dimensions of the clearance hole extend directly to an outer conductive surface of a ground via rod keeping the full value connections of ground vias and ground plates.

34. A transition from a signal via to a planar transmission line formed in a multilayer PCB according to claim 33, wherein:
dimensions of the clearance hole of the via transmission line are extended to the ground via centers minus the radius of the pad for the ground via determined by dimensional tolerances of a via fabrication technology in the multilayer PCB for full value connections of the ground vias and the ground plates.

35. A transition from a signal via to a planar transmission line formed in a multilayer PCB according to claim 33 wherein:
dimensions of the clearance hole are determined as extended directly to the outer conductive surface of the ground via rod and, in addition, cylindrical pads are formed around ground vias for full value connections of ground vias and ground plates taking into account dimensional tolerances of a via fabrication technology in the multilayer PCB.

36. A transition from a signal via to a planar transmission line formed in a multilayer PCB according to claim 33, wherein:
a clearance hole of the via transmission line has a circular cross-sectional shape with the radius determined as the distance from the center of the signal via to an outer conductive surface of the ground via rod of the nearest ground via from the outer conductive boundary of the via transmission line.

37. A transition from a signal via to a planar transmission line formed in a multilayer PCB according to claim 33, wherein:
a clearance hole of the via transmission line has a circular cross-sectional shape with the radius determined as the distance from the center of the via transmission line via to the nearest ground via center from the outer conductive boundary of the via transmission line minus the radius of the cylindrical pad for the ground via determined by dimensional tolerances of a via fabrication technology in the multilayer PCB for full value connections of the ground vias and the ground plates.

38. A transition from a signal via to a planar transmission line formed in a multilayer PCB according to claim 33, wherein:
a clearance hole of the via transmission line has circular cross-sectional shape with the radius determined as the distance from the center of the signal via to a conductive surface of the ground via rod of nearest ground via from the outer conductive boundary of the via transmission line and, in addition, cylindrical pads are formed around the ground vias determined by dimensional tolerances for full value connections of the ground vias and the ground plates according to a via fabrication technology in the multilayer PCB.

39. A transition from a signal via to a planar transmission line formed in a multilayer PCB according to claim 33, wherein:
the distance between neighboring ground vias in the outer conductive boundary of the via transmission line is less than $\lambda/8$ or equal to $\lambda/8$, where $\lambda$ is taken as the shortest wavelength in the isolation material of the multilayer PCB at the predetermined frequency range.

40. A transition from a differential signal via pair formed on the base of at least one of plated-through holes, blind vias, buried vias, and counter-bored vias to a pair of coupled planar transmission lines embedded in a multilayer PCB comprising:
a pair of signal vias;
a pair of coupled planar transmission lines connected to the pair of signal vias by means of cylindrical pads foreseen for a full value connection of the signal vias and the pair of planar transmission lines; and
a via transmission line formed by the differential signal via pair acting as an inner conductive boundary of the via transmission line, an assembly of ground vias surrounding the differential signal via pair, a set of ground plates from conductor layers of the multilayer PCB where the assembly of ground vias and the set of ground plates act as the outer conductive boundary of the via transmission line, a PCB isolating material disposed between inner and outer conductive boundaries of the via transmission line and separating the signal vias and conductive parts of the outer conductive boundary of the via transmission line, the PCB isolating material having a cylindrical clearance hole establishing a broadband operation of the via transmission line by means of its cross-sectional shape and dimensions which are determined, wherein a contour of the outer cross-sectional shape of the clearance hole corresponds to an arrangement of ground vias in the outer conductive boundary of the via transmission line and dimensions of the clearance hole extend directly to an outer conductive surface of a ground via rod keeping the full value connections of ground vias and ground plates.

41. A transition from a differential signal via pair formed on at least one of the base of plated-through holes, blind vias, buried vias, and counter-bored vias to a pair of coupled planar transmission lines embedded in a multilayer PCB according to claim 40, wherein:
dimensions of the clearance hole of the via transmission line are extended to the ground via centers minus the radius of the pad for the ground via determined by dimensional tolerances of a via fabrication technology in the multilayer PCB for full value connections of the ground vias and the ground plates.

42. A transition from a differential signal via pair formed on at least one of the base of plated-through holes, blind vias, buried vias, and counter-bored vias to a pair of coupled planar transmission lines embedded in a multilayer PCB according to claim 40, wherein:
dimensions of the clearance hole are determined as extended directly to the outer conductive surface of the ground via rod and, in addition, cylindrical pads are formed around ground via for full value connections of ground vias and ground plates taking into account dimensional tolerances of a via fabrication technology in the multilayer PCB.

43. A transition from a differential signal via pair formed on at least one of the base of plated-through holes, blind vias, buried vias, and counter-bored vias to a pair of coupled planar transmission lines embedded in a multilayer PCB according to claim 40, wherein:
a clearance hole of the via transmission line has circular cross-sectional shape with the radius determined as the distance from the center of the signal via to conductive surface of the rod of the nearest ground via from the outer conductive boundary of the via transmission line.

44. A transition from a differential signal via pair formed on at least one of the base of plated-through holes, blind vias, buried vias, and counter-bored vias to a pair of coupled planar transmission lines embedded in a multilayer PCB according to claim 40, wherein:
a clearance hole of the via transmission line has circular cross-sectional shape with the radius determined as the distance from the center of the via transmission line via to the nearest ground via center from the outer conductive boundary of the via transmission line minus the radius of the cylindrical pad for the ground via determined by dimensional tolerances of used via fabrication technology in a multilayer PCB for full value connections of the ground vias and the ground plates.

45. A transition from a differential signal via pair formed on at least one of the base of plated-through holes, blind vias, buried vias, and counter-bored vias to a pair of coupled planar transmission lines embedded in a multilayer PCB according to claim 40, wherein:

a clearance hole of the via transmission line has circular, cross-sectional shape with the radius determined as the distance from the center of the signal via to the outer conductive surface of the rod of nearest ground via from the outer conductive boundary and, in addition, cylindrical pads are formed around the ground vias determined by dimensional tolerances for full value connections of the ground vias and the ground plates according to a via fabrication technology in the multilayer PCB.

46. A transition from a differential signal via pair formed on at least one of the base of plated-through holes, blind vias, buried vias, and counter-bored vias to a pair of coupled planar transmission lines embedded in a multilayer PCB according to claim 40, wherein:

the distance between neighboring ground vias in the outer conductive boundary of the via transmission line is less than $\lambda/8$ or equal to $\lambda/8$, where $\lambda$ is taken as the shortest wavelength in the isolation material of the multilayer PCB at the predetermined frequency range.

* * * * *